(12) United States Patent
Inukai

(10) Patent No.: US 7,071,911 B2
(45) Date of Patent: Jul. 4, 2006

(54) LIGHT EMITTING DEVICE, DRIVING METHOD THEREOF AND ELECTRIC EQUIPMENT USING THE LIGHT EMITTING DEVICE

(75) Inventor: Kazutaka Inukai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 132 days.

(21) Appl. No.: 10/023,143

(22) Filed: Dec. 18, 2001

(65) Prior Publication Data

US 2002/0140364 A1    Oct. 3, 2002

(30) Foreign Application Priority Data

Dec. 21, 2000    (JP)    .............................. 2000-388990

(51) Int. Cl.
     *G09G 3/36*    (2006.01)
     *G09G 3/10*    (2006.01)

(52) U.S. Cl. .......................... 345/92; 345/98; 345/100; 315/169.3

(58) Field of Classification Search ................ 345/92, 345/76, 77, 87, 89, 93, 694, 695, 98, 100; 315/169.1–169.3; 349/42, 48
See application file for complete search history.

(56) References Cited

U.S. PATENT DOCUMENTS

| | | | | |
|---|---|---|---|---|
| 5,122,881 A | * | 6/1992 | Nishizawa et al. | .......... 348/301 |
| 5,691,783 A | * | 11/1997 | Numao et al. | ................ 345/92 |
| 5,903,248 A | * | 5/1999 | Irwin | .......................... 345/98 |
| 5,903,249 A | * | 5/1999 | Koyama et al. | .............. 345/92 |
| 5,929,474 A | * | 7/1999 | Huang et al. | ................ 257/292 |
| 6,011,531 A | * | 1/2000 | Mei et al. | ...................... 345/92 |
| 6,225,750 B1 | * | 5/2001 | Kimura | ........................ 345/92 |
| 6,229,506 B1 | * | 5/2001 | Dawson et al. | ................ 345/92 |

(Continued)

FOREIGN PATENT DOCUMENTS

EP    0 949 603    10/1999

(Continued)

OTHER PUBLICATIONS

Tsutsui, Tetsuo, et al, "Electroluminescence in Organic Thin Films," Photochemical Processes in Organized Molecular Systems, pp. 437-450, 1991.

(Continued)

*Primary Examiner*—Bipin Shalwala
*Assistant Examiner*—David L. Lewis
(74) *Attorney, Agent, or Firm*—Cook, Alex, McFarron, Manzo, Cummings & Mehler, Ltd.

(57) ABSTRACT

A light emitting device is provided which is capable of displaying a high gradation image while preventing the drive frequency of a source signal line driving circuit from increasing. One pixel has a plurality of sub-pixels each having the same area of effective light emission. Sub-frame periods in each of the sub-pixels are all used to control the gradation of the corresponding pixel. The present light emitting device can operate as follows when, for example, adopting time gradation according to binary code. A sub-frame period for a specific bit is divided into a plurality of sub-frame periods, and a sub-frame period for another bit or a period in which no image is displayed (non-display period) is interspersed between the divided sub-frame periods, not successively starting the divided sub-frame periods. In a non-display period, light emitting, elements in all of the pixels in the pixel portion do not emit light.

56 Claims, 17 Drawing Sheets

U.S. PATENT DOCUMENTS

| | | | |
|---|---|---|---|
| 6,249,087 B1 * | 6/2001 | Takayama et al. | 345/204 |
| 6,326,981 B1 * | 12/2001 | Mori et al. | 345/694 |
| 6,329,971 B1 * | 12/2001 | McKnight | 345/95 |
| 6,356,029 B1 * | 3/2002 | Hunter | 345/92 |
| 6,501,227 B1 * | 12/2002 | Koyama | 345/76 |
| 6,512,504 B1 * | 1/2003 | Yamauchi et al. | 345/92 |
| 6,528,950 B1 * | 3/2003 | Kimura | 345/92 |
| 6,548,960 B1 | 4/2003 | Inukai | |
| 6,583,576 B1 * | 6/2003 | Koyama | 345/92 |
| 6,756,740 B1 | 6/2004 | Inukai | |
| 6,791,129 B1 | 9/2004 | Inukai | |
| 2002/0000576 A1 | 1/2002 | Inukai | |

FOREIGN PATENT DOCUMENTS

| | | |
|---|---|---|
| EP | 1 103 946 A2 | 5/2001 |
| JP | 11-073158 | 3/1999 |

OTHER PUBLICATIONS

Baldo, M.A. et al, "Highly Efficient Phosphorescent Emission from Organic Electroluminescent Devices," Nature, vol. 395, pp. 151-154, Sep. 10, 1998.

Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, 1999.

English Abstract re Japanese Patent Application No. JP 11-073158, published Mar. 16, 1999.

* cited by examiner

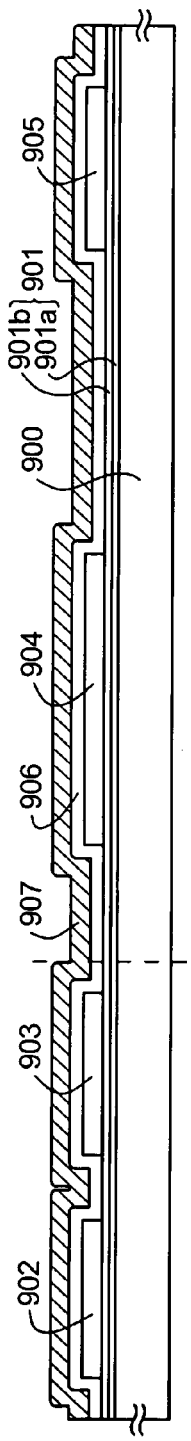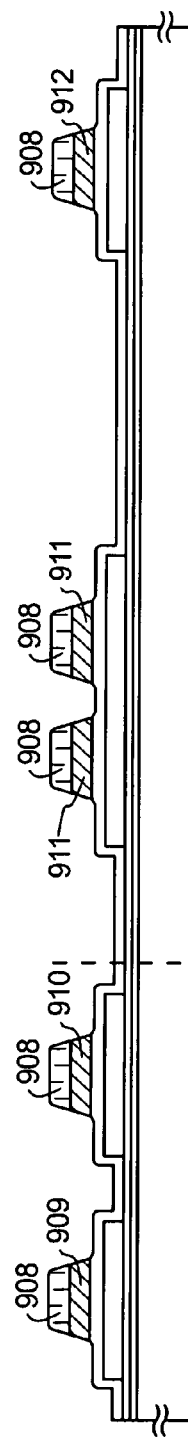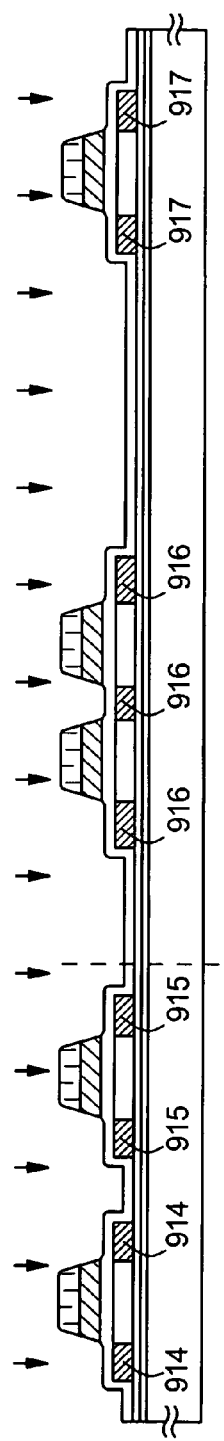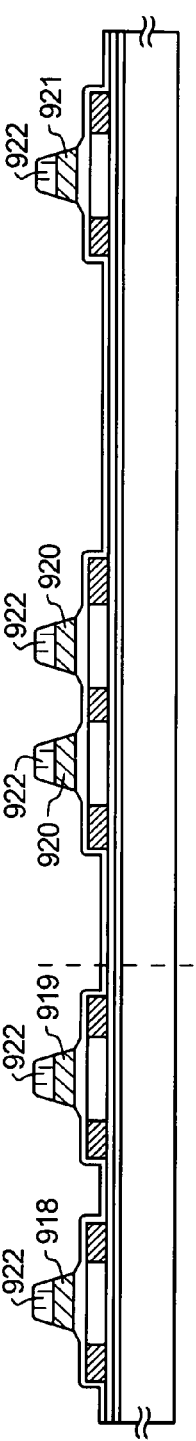

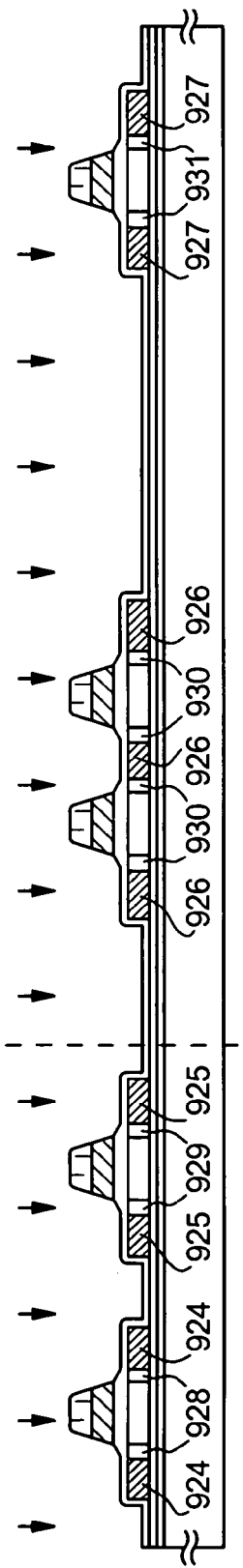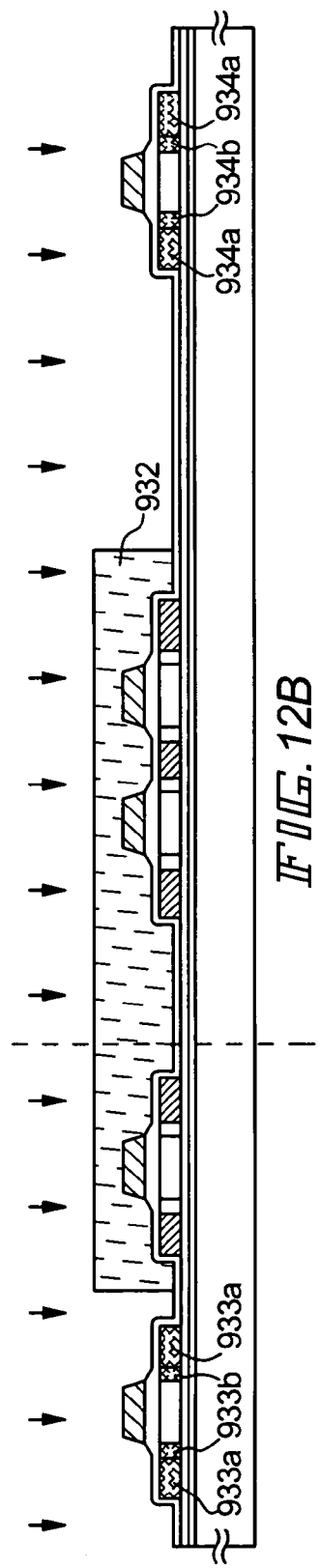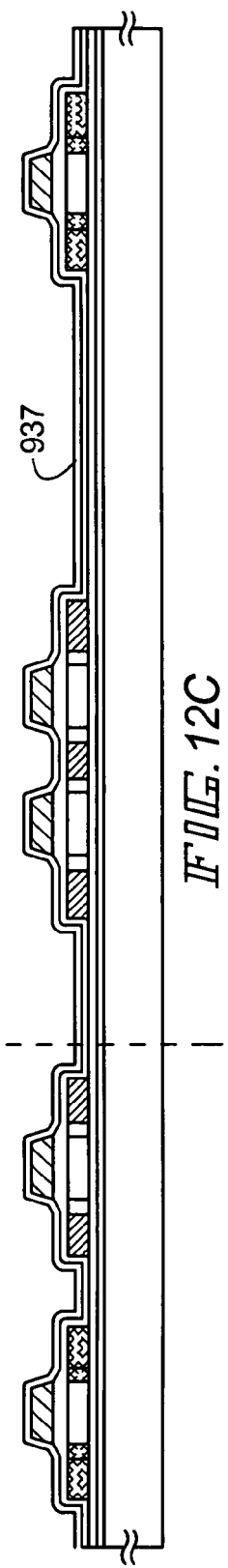

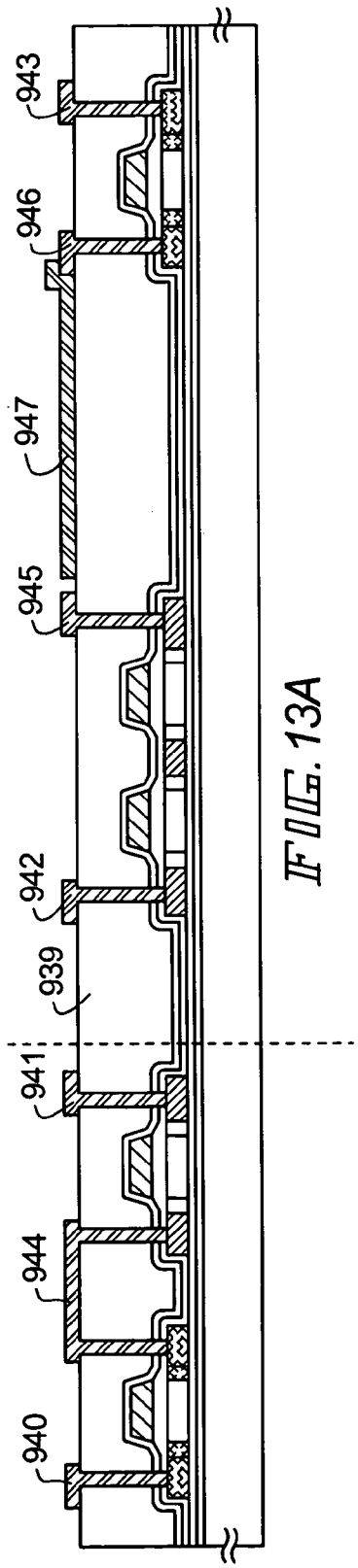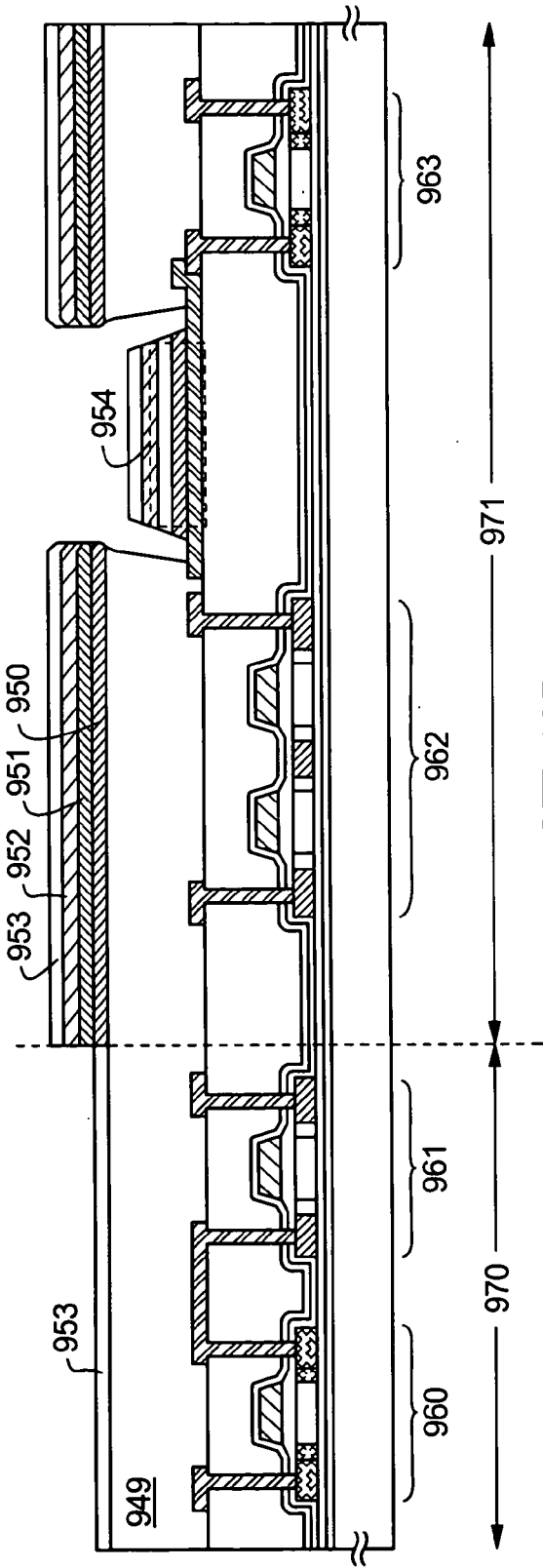

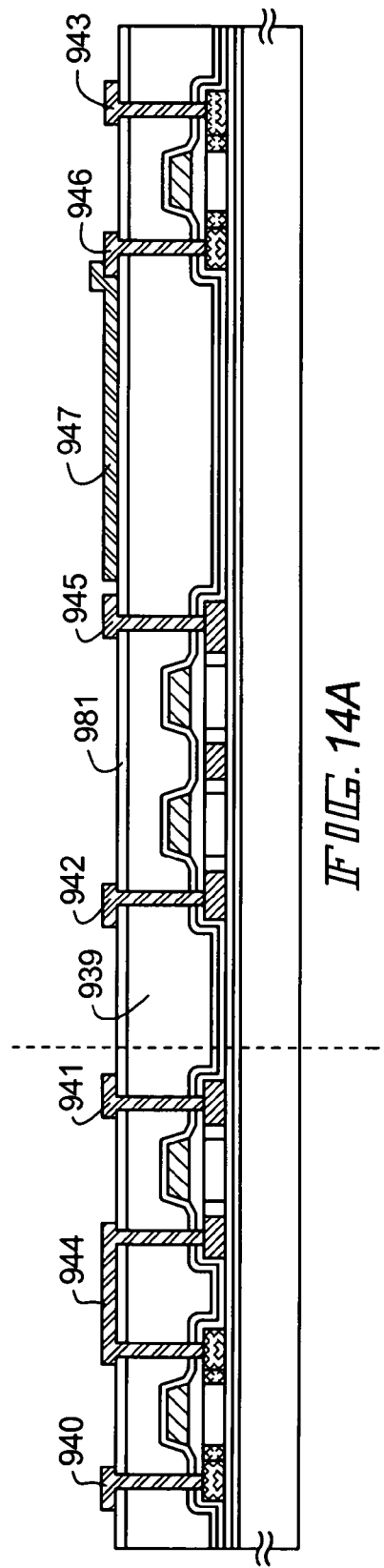
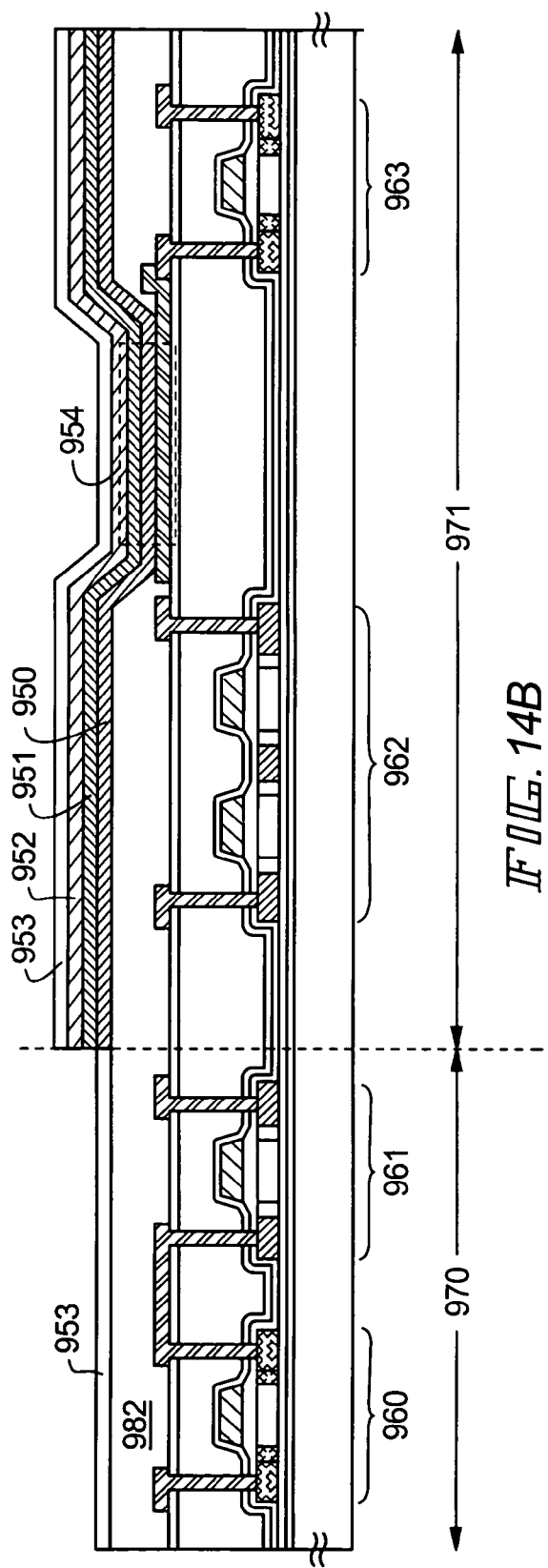
FIG. 14A
FIG. 14B

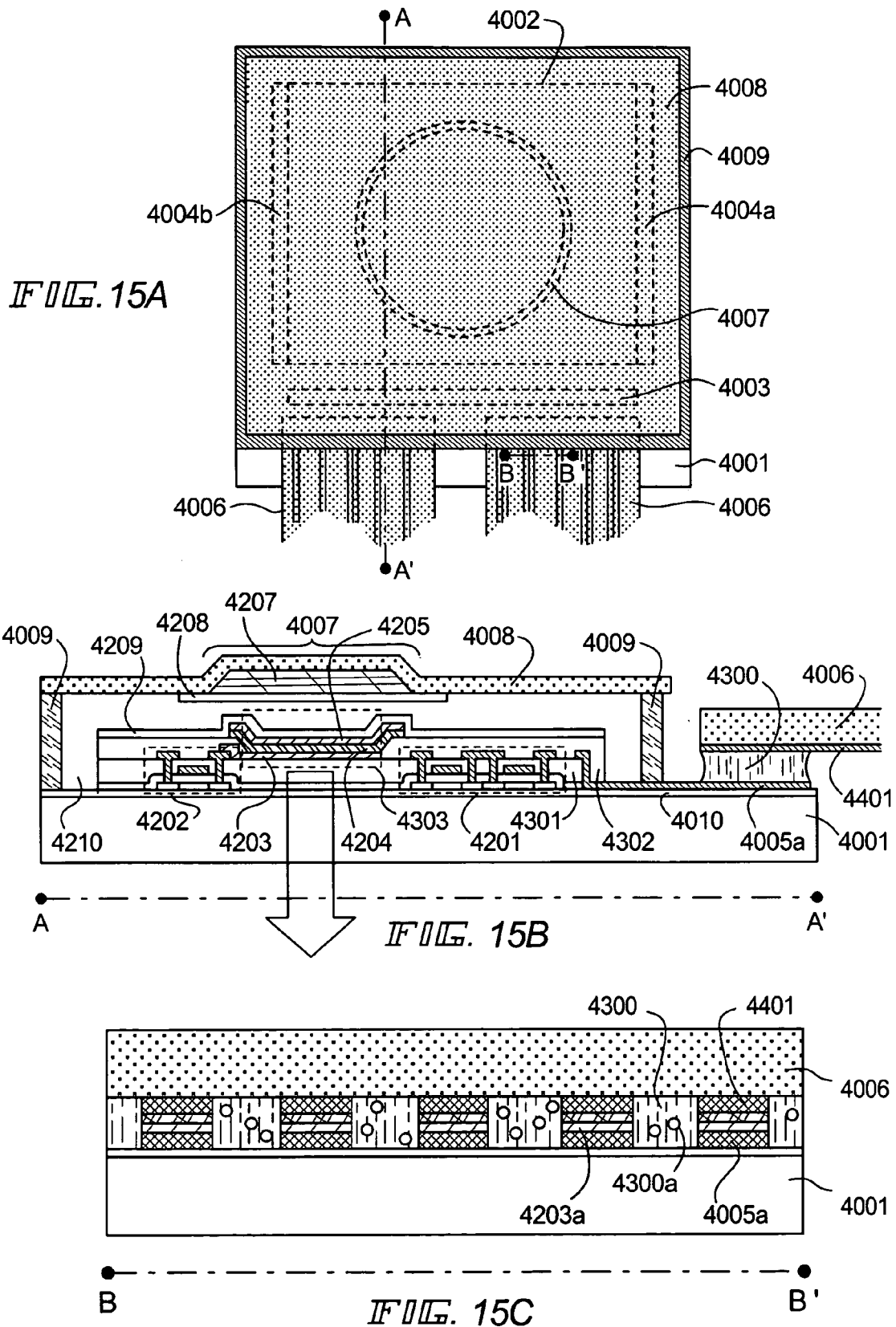

LIGHT EMITTING DEVICE, DRIVING METHOD THEREOF AND ELECTRIC EQUIPMENT USING THE LIGHT EMITTING DEVICE

BACKGROUND OF THE INVENTION

1. Field of the Invention

The present invention relates to a display panel in which a light emitting element is formed on a substrate and is sandwiched between the substrate and a cover member. The invention also relates to a display module obtained by mounting IC to the display panel. In this specification, the display panel and the display module are called by a generic term, light emitting device. The present invention also relates to a method of driving the light emitting device and to electronic equipment using the light emitting device.

2. Description of the Related Art

Being self-luminous, light emitting elements eliminate the need for back light necessary in liquid crystal display devices (LCDs) and therefore can make thinner devices. In addition, light emitting elements have higher visibility and no limitation in terms of viewing angle, and these are the reasons for attention that light emitting devices using light emitting elements are receiving in recent years as display devices to replace CRTs and LCDs.

A light emitting element has a layer containing an organic compound that provides luminescence (electro luminescence) generated upon application of electric field (hereinafter referred to as organic compound layer), as well as an anode layer and a cathode layer. Luminescence provided by organic compounds is divided into light emission upon return to base state from singlet excitation (fluorescence) and light emission upon return to base state from triplet excitation (phosphorescence). Both types of light emission can be used in a light emitting, device of the present invention.

All the layers that are provided between an anode and a cathode are an organic compound layer in this specification. Specifically, the organic compound layer includes a light emitting layer, a hole injection layer, an electron injection layer, a hole transporting layer, an electron transporting layer, etc. A basic structure of a light emitting element is a laminate of an anode, a light emitting layer, and a cathode layered in this order. The basic structure can be modified into a laminate of an anode, a hole injection layer, a light emitting layer, and a cathode layered in this order, or a laminate of an anode, a hole injection layer, a light emitting layer, an electron transporting layer, and a cathode layered in this order.

In this specification, making a light emitting element emit light is expressed as driving the light emitting element. The light emitting element as defined herein is an element that is composed of an anode, an organic compound layer, and a cathode.

Methods of driving a light emitting device having a light emitting element are roughly divided into analog driving methods and digital driving methods. Digital driving is deemed more promising in view of transition from analog broadcasting to digital broadcasting since it enables the light emitting device to display an image using a digital video signal that carries image information as it is without converting the signal into an analog signal.

Among the driving methods that obtain gradation display by binary voltages of digital video signals, there is a time division driving method in which lengths of time for lighting a pixel are controlled to obtain gradation display.

In the time division driving method, one frame period is divided into a plurality of sub-frame periods. In each sub-frame period, to be lit or not is determined for the respective pixels in accordance with digital video signals. The accumulated lengths of sub-frame periods during which a pixel is lit with respect to the length of the entire sub-frame periods in one frame period determine the gradation of that pixel.

Described below are the structure of a pixel portion in a common light emitting device, and a driving method thereof.

FIG. 17A is an enlarged view of a pixel portion 7000 in a common light emitting device. The pixel portion 7000 has source signal lines S1 to Sx, power supply lines V1 to Vx, and gate signal lines G1 to Gy.

A region provided with one of the source signal lines S1 to Sx, one of the power supply lines V1 to Vx, and one of the gate signal lines G1 to Gy corresponds to a pixel 7001. The pixel portion 7000 has a plurality of pixels that are arranged to form a matrix.

FIG. 17B shows an enlarged view of the pixel 7001. The pixel 7001 has a source signal line Si (one of the source signal lines S1 to Sx), a power supply line Vi (one of the power supply lines V1 to Vx), and a gate signal line Gj (one of the gate signal lines G1 to Gy).

The pixel 7001 also has a switching TFT 7002, a driving TFT 7003, a light emitting element 7004, and a capacitor 7005.

The switching TFT 7002 has a gate electrode connected to the gate signal line Gj. The switching TFT 7002 also has a source region and a drain region one of which is connected to the source signal line Si and the other of which is connected to a gate electrode of the driving TFT 7003 and to the capacitor 7005.

The driving TFT 7003 has a source region and a drain region one of which is connected to the power supply line Vi and the other of which is connected to a pixel electrode of the light emitting element 7004. The power supply line Vi is connected to the capacitor 7005.

The light emitting element 7004 is composed of an anode, a cathode, and an organic compound layer placed between the anode and the cathode. If the anode is in contact with the source region or the drain region of the driving TFT 7003, the anode serves as the pixel electrode whereas the cathode serves as an opposite electrode. On the other hand, the cathode serves as the pixel electrode whereas the anode serves as the opposite electrode if the cathode is in contact with the source region or the drain region of the driving TFT 7003.

The opposite electrode of the light emitting element 7004 is provided with a given electric potential (opposite electric potential). The power supply line Vi is provided with a given electric potential (power supply electric potential). The power supply electric potential and the opposite electric potential are supplied from a power source provided in an external IC or the like to the display panel.

The light emitting device structured as shown in FIGS. 17A and 17B is driven by the time division driving method to display an image. The operation thereof is described next with reference to FIG. 18. In the time division driving method, one frame period has a plurality of sub-frame periods. FIG. 18 shows points at which sub-frame periods are started in the light emitting device structured as shown in FIGS. 17A and 17B, and the axis of abscissa indicates the time scale whereas the axis of ordinate indicates positions of gate signal lines.

In FIG. 18, one frame period has n (n is a natural number) sub-frame periods SF1 to SFn. In each of the n sub-frame periods, digital video signals equivalent to one bit are inputted to each of the pixels. The digital video signals determine whether the light emitting elements in each of the pixels emit light or not.

To detail the above operation, the gate signal lines G1 to Gy are selected one by one to turn the switching TFT 7002 connected to the selected gate signal line ON. In this specification, a signal line being selected means turning every TFT whose gate electrode is connected to the selected signal line ON.

While each of the gate signal lines is selected, digital video signals equivalent to one bit are inputted to the gate electrode of the driving TFT 7003 from the source signal lines S1 to Sy through the switching TFT 7002 that is ON.

Switching of the driving TFT 7003 is controlled by the digital video signals. When the driving TFT 7003 is turned ON, the power supply electric potential is given to the pixel electrode of the light emitting element 7004, and the difference in electric potential between the power supply electric potential and the opposite electric potential causes the light emitting element 7004 to emit light. On the other hand, when the driving TFT 7003 is turned OFF, the power supply electric potential is not given to the pixel electrode of the light emitting element 7004 and therefore the light emitting element 7004 does not emit light. Note, in this specification, the state that the light emitting element emits a light is called as "light emitting state", while the state that the light emitting element does not emit a light is called as "non-light emitting state".

When the digital video signals are inputted to all of the pixels, one sub-frame period is ended to start the next sub-frame period. The operation described above is repeated and whether or not the light emitting, element 7004 emits light in each pixel is determined for each of the sub-frame periods SF1 to SFn. As a result, levels of gradations of the pixels are controlled and one image is displayed upon completion of one frame period.

The driving method described above needs to put at least n sub-frame periods in one frame period if an image is displayed using n bit digital video signals. Therefore, when the bit number of digital video signals is increased in order to raise the gradation number of an image, sub-frame periods in one frame period is increased in number.

In an ordinary light emitting device, it is preferable to set 60 or more frame periods in one second. If the number of images displayed in one second is less than 60, flickering of an image may be noticeable to a viewer. In order to contain flickering of an image and display a high gradation image without lowering the frame frequency, lengths of sub-frame periods have to be shortened.

However, when lengths of sub-frame periods are shortened, the speed of inputting digital video signals to pixels may become insufficient for the shortened sub-frame periods. Details of this problem are described below with reference to FIGS. 19A and 19B.

FIGS. 19A and 19B show points at which sub-frame periods SF(k−1), SFk, and SF(k+1) (k is an arbitrary natural number) are started in a common time division driving method, and the axis of abscissa indicates the time scale whereas the axis of ordinate indicates positions of gate signal lines. Reference symbol t1 denotes the length of time for inputting digital video signals equivalent of one bit to every pixel in the sub-frame period SFk and t2 denotes the length of the sub-frame period SFk in pixels in each line. One line of pixels have the same gate signal line.

FIG. 19A shows a case of t1≦t2 whereas FIG. 19B shows a case of t1>t2.

In the case of t1≦t2 shown in FIG. 19A, digital video signals equivalent to one bit are inputted to every pixel after the k-th sub-frame period SFk is ended and this input operation is finished before the next sub-frame period, the (k+1)-th sub-frame period SF(k+1) is started. Accordingly, input of digital video signals equivalent of one bit to pixels and input of the next set of one hit digital video signals do not take place concurrently in the same pixel portion.

On the other hand, in the case of t1>t2 shown in FIG. 19B, input of digital video signals equivalent to one bit to pixels is not finished even after the k-th sub-frame period SFk is ended. In other words, input of the next set of one bit digital video signals to pixels has to be started during the first set of one bit digital video signals are inputted to pixels.

When the sub-frame period t2 is shortened until t1>t2 is satisfied in order to raise the gradation number, the device has to be driven as shown in FIG. 19B. However, the light emitting device structured as FIGS. 17A and 17B cannot be driven in the way shown in FIG. 19B. In order to satisfy t1≦t2, shortening the sub-frame period t2 alone is not sufficient and the period t1 for inputting digital video signals equivalent to one bit to every pixel has to be shortened.

To shorten t1, the drive frequency of a source signal line driving circuit that controls input of digital video signals to the source signal lines needs to be high. However, if the drive frequency of the source signal line driving circuit is too high, transistors of the source signal line driving circuit cannot deal with the drive frequency to fail to operate or lose the reliability.

SUMMARY OF THE INVENTION

The present invention has been made in view of solving the problems above and an object of the present invention is therefore to provide light emitting device with a novel structure capable of displaying a high gradation image.

In a light emitting device of the present invention, one pixel has a plurality of sub-pixels and the area that actually provides light emission (area of effective light emission) is the same in every sub-pixel. The effective light emission area of a light emitting element refers to the area of a region of a pixel electrode of the light emitting element where emitted light is not blocked by TFTs, wiring lines, and other untransmissive components formed on a substrate.

According to the present invention, sub-frame periods in each sub-pixel are all used to control the gradation of the related pixel.

With the above structure, the number of sub-frame periods in one frame period can be increased without shortening lengths of the sub-frame periods. Accordingly, a period for inputting digital video signals to pixels (writing period) can be prevented from being short. Thus a high gradation image can be displayed while avoiding lowering of frame frequency and too high drive frequency of the source signal line driving circuit.

In addition, the sub-pixels have almost the same area of effective light emission unlike a general area division driving method. In a general area division driving method, design is made by setting the design rule for the smallest sub-pixel and it is therefore difficult to raise the definition. On the other hand, the light emitting device of the present invention can raise the definition because the effective light emission area of the sub-pixels is almost the same when the gradation number is increased.

Moreover, the light emitting device of the present invention can operate as follows when, for example, adopting time gradation according to binary code. A sub-frame period for a specific bit is divided into a plurality of sub-frame periods, and a sub-frame period for another bit or a period in which no image is displayed (non-display period) is interspersed between the divided sub-frame periods instead of successively starting the divided sub-frame periods. In a non-display period, light emitting elements in all of the pixels in the pixel portion do not emit light.

The animation pseudocontour can be avoided by the above structure.

Furthermore, in the light emitting device of the present invention, the length of one sub-frame period is not shortened when a sub-frame period is divided to avoid the animation pseudocontour. The drive frequency of the source signal line driving circuit is thus prevented from increasing.

Structures of the present invention are shown below.

The invention disclosed in this specification is a light emitting device having a plurality of pixels, characterized in that:
  each of the plural pixels has a plurality of sub-pixels;
  each of the plural sub-pixels has a light emitting element; and
  each of the plural sub-pixels has the same area of effective light emission.

The invention disclosed in this specification is a light emitting device having a plurality of pixels, characterized in that:
  each of the plural pixels has a plurality of sub-pixels;
  each of the plural sub-pixels has a light emitting element;
  each of the plural sub-pixels has the same area of effective light emission; and
  the digital video signal controls the period of time in which the light emitting element emits light in each of the plural sub-pixels to thereby control the gradation of the respective pixels.

The invention disclosed in this specification is a light emitting, device having a plurality of pixels, characterized in that:
  each of the plural pixels has a plurality of sub-pixels;
  each of the plural sub-pixels has a light emitting element;
  each of the plural sub-pixels has the same area of effective light emission;
  one frame period has a plurality of sub-frame periods in the plural sub-pixels;
  each of the bits of digital video signals determines whether or not the light emitting element in each of the plural sub-pixels emits light for each of the plural sub-frame periods; and
  the larger the sum of lengths of sub-frame periods in which the light emitting element in each of the plural sub-pixels emits light becomes, the higher the gradation number of the respective pixels becomes.

The invention disclosed in this specification is a light emitting device having a plurality of pixels, characterized in that:
  each of the plural pixels has a plurality of sub-pixels;
  each of the plural sub-pixels has a light emitting element and a thin film transistor (TFT);
  a current flowing in the light emitting element is controlled by the TFT; and
  each of the plural sub-pixels has the same area of effective light emission.

The invention disclosed in this specification is a light emitting device having a plurality of pixels, characterized in that:
  each of the plural pixels has a plurality of sub-pixels;
  each of the plural sub-pixels has a light emitting element, a first TFT, a second TFT, and a third TFT;
  the first TFT is turned ON in the same period in all of the plural sub-pixels;
  an electric potential of a digital video signal is given to a rate electrode of the second TFT during the first TFT is ON;
  the electric potential of the digital video signal controls switching of the second TFT to determine whether the light emitting element emits light or not;
  the light emitting element does not emit light when the third TFT is ON;
  the digital video signal controls the period of time in which the light emitting element emits light in each of the plural sub-pixels to thereby control the gradation of the respective pixels; and
  each of the plural sub-pixels has the same area of effective light emission.

The invention disclosed in this specification is a light emitting, device having a plurality of pixels, characterized in that:
  each of the plural pixels has a plurality of sub-pixels;
  each of the plural sub-pixels has a light emitting, element, a first TFT, a second TFT, a third TFT, a source signal line, a writing gate signal line, an erasing gate signal line, and a power supply line;
  a gate electrode of the first TFT is connected to the writing gate signal line;
  the first TFT has a source region and a drain region which is connected to the source signal line and the other of which is connected to a gate electrode of the second TFT;
  a source region of the second TFT is connected to the power supply line and a drain region of the second TFT is connected to a pixel electrode of the light emitting element;
  a gate electrode of the third TFT is connected to the erasing gate signal line;
  the third TFT has a source region and a drain region one of which is connected to the power supply line and the other of which is connected to the gate electrode of the second TFT;
  writing gate signal lines of the plural pixels are selected in the same period;
  digital video signal inputted to the source signal line controls the period of time in which the light emitting element emits light in each of the plural sub-pixels to thereby control the gradation of each of the plural pixels; and
  each of the plural sub-pixels has the same area of effective light emission.

The invention disclosed in this specification is a light emitting device having a plurality of pixels, characterized in that:
  each of the plural pixels has a plurality of sub-pixels;
  each of the plural sub-pixels has a light emitting element, a first TFT, a second TFT, a third TFT, a source signal line, an erasing gate signal line, and a power supply line;
  plural sub-pixels in the same pixel have commonly a writing gate signal line;
  a gate electrode of the first TFT is connected to the writing gate signal line;
  the first TFT has a source region and a drain region one of which is connected to the source signal line and the other of which is connected to a gate electrode of the second TFT;
  a source region of the second TFT is connected to the power supply line and a drain region of the second TFT is connected to a pixel electrode of the light emitting element;
  a gate electrode of the third TFT is connected to the erasing gate signal line;

the third TFT has a source region and a drain region one of which is connected to the power supply line and the other of which is connected to the gate electrode of the second TFT;

writing gate signal lines of the plural pixels are selected in the same period;

digital video signal inputted to the source signal line control the period of time in which the light emitting element emits light in each of the plural sub-pixels to thereby control the gradation of each of the plural pixels; and each of the plural sub-pixels has the same area of effective light emission.

The invention disclosed in this specification is a light emitting device having a plurality of pixels, characterized in that:

each of the plural pixels has a plurality of sub-pixels;

each of the plural sub-pixels has a light emitting element, a first TFT, a second TFT, a third TFT, a source signal line, a writing gate signal line, and an erasing gate signal line;

the plural sub-pixels in the same pixel have commonly a power supply line;

a gate electrode of the first TFT is connected to the writing gate signal line;

the first TFT has a source region and a drain region one of which is connected of to the source signal line and the other of which is connected to a gate electrode of the second TFT;

a source region of the second TFT is connected to the power supply line and a drain region of the second TFT is connected to a pixel electrode of the light emitting element;

a gate electrode of the third TFT is connected to the erasing gate signal line;

the third TFT has a source region and a drain region one of which is connected to the power supply line and the other of which is connected to the gate electrode of the second TFT;

writing gate signal lines of the plural pixels are selected in the same period;

digital video signal inputted to the source signal line controls the period of time in which the light emitting element emits light in each of the plural sub-pixels to thereby control the gradation of each of the plural pixels; and each of the plural sub-pixels has the same area of effective light emission.

The invention disclosed in this specification is a light emitting device having a plurality of pixels, characterized in that:

each of the plural pixels has a plurality of sub-pixels;

each of the plural sub-pixels has a light emitting element, a first TFT, a second TFT, a third TFT, a source signal line, and an erasing gate signal line;

the plural sub-pixels in the same pixel have commonly a writing gate signal line and a power supply line;

a gate electrode of the first TFT is connected to the writing gate signal line;

the first TFT has a source region and a drain region one of which is connected to the source signal line and the other of which is connected to a gate electrode of the second TFT;

a source region of the second TFT is connected to the power supply line and a drain region of the second TFT is connected to a pixel electrode of the light emitting element;

a gate electrode of the third TFT is connected to the erasing gate signal line;

the third TFT has a source region and a drain region one of which is connected to the power supply line and the other of which is connected to the gate electrode of the second TFT;

writing gate signal lines of the plural pixels are selected in the same period;

digital video signal inputted to the source signal line controls the period of time in which the light emitting element emits light in each of the plural sub-pixels to thereby control the gradation of the respective pixels; and each of the plural sub-pixels has the same area of effective light emission.

The present invention may be characterized in that the first TFT in each of the plural sub-pixels has the same polarity.

The present invention may be characterized in that the second TFT in each of the plural sub-pixels has the same polarity.

The present invention may be characterized in that the third TFT in each of the plural sub-pixels has the same polarity.

The present invention may be electronic apparatuses characterized by comprising the light emitting device.

BRIEF DESCRIPTION OF THE DRAWINGS

FIGS. 11A to 11D are diagrams showing a process of manufacturing TFTs of a light emitting device of Embodiment 8;

FIGS. 12A to 12C are diagrams showing a process of manufacturing TFTs of a light emitting device of Embodiment 8;

FIGS. 13A and 13B are diagrams showing a process of manufacturing TFTs of a light emitting device of Embodiment 8;

FIGS. 14A and 14B are diagrams showing a process of manufacturing TFTs of a light emitting device of Embodiment 9;

FIGS. 15A and 15B–15C are a top view of a light emitting device of and sectional views thereof, respectively, of Embodiment 11;

DETAILED DESCRIPTION OF THE PREFERRED EMBODIMENTS

Embodiment Mode

Figure 1A:
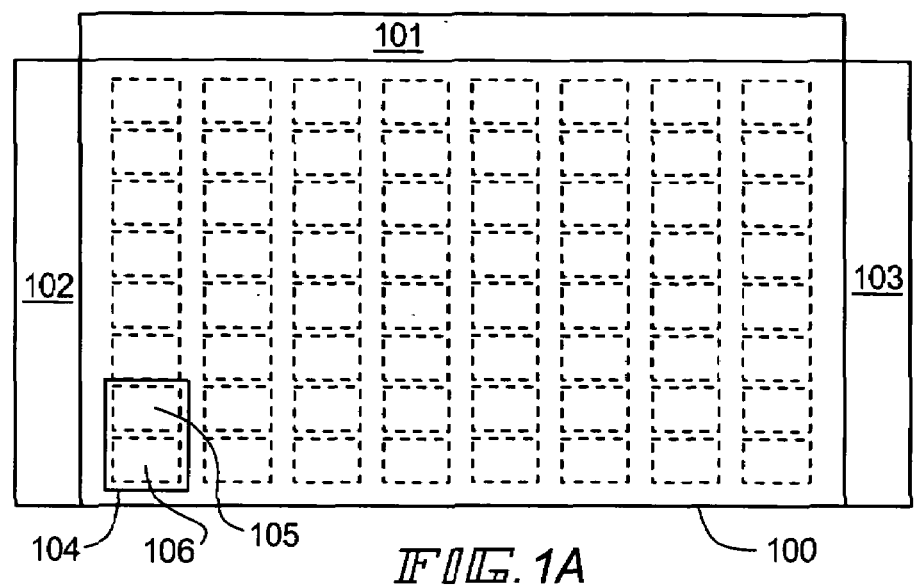
FIGS. 1A and 1B are a block diagram of a light emitting device and a circuit diagram of a pixel, respectively, of the present invention.

The structure of a light emitting device of the present invention will be described with reference to FIGS. 1A and 1B and FIG. 2. FIG. 1A is a block diagram of a display panel included in the light emitting device of the present invention. On a substrate (not shown in the drawing), a pixel portion 100, a source signal line driving circuit 101, a writing gate signal line driving circuit 102, and an erasing gate signal line driving circuit 103 are provided.

The pixel portion 100 and a driving circuit group (including the source signal line driving circuit 101, the writing gate signal line driving circuit 102, and the erasing gate signal line driving circuit 103) are formed on the same substrate in this embodiment mode, but the present invention is not limited thereto. The pixel portion 100 and the driving circuit group may be formed on different substrates to be connected to each other through a connector such as an FPC.

Numbers of the source signal line driving circuit 101 and the gate signal line driving circuits (including the writing gate signal line driving circuit 102 and the erasing gate signal line driving circuit 103) are not limited to those shown in FIG. 1A. The number of the source signal line driving circuits 101 provided may be one or more. One or more gate signal line driving circuits may be provided, and one gate signal line driving circuit may substitute for the writing gate signal line driving circuit 102 and the erasing gate signal line driving circuit 103.

In the pixel portion 100, a plurality of pixels form a matrix and each pixel 104 has a plurality of sub-pixels. Each pixel may have as many sub-pixels as can be formed. In this embodiment mode, the description is given taking as an example a case where one pixel 104 has two sub-pixels, namely, a first sub-pixel 105 and a second sub-pixel 106, for the sake of simple explanation.

Figure 1B:
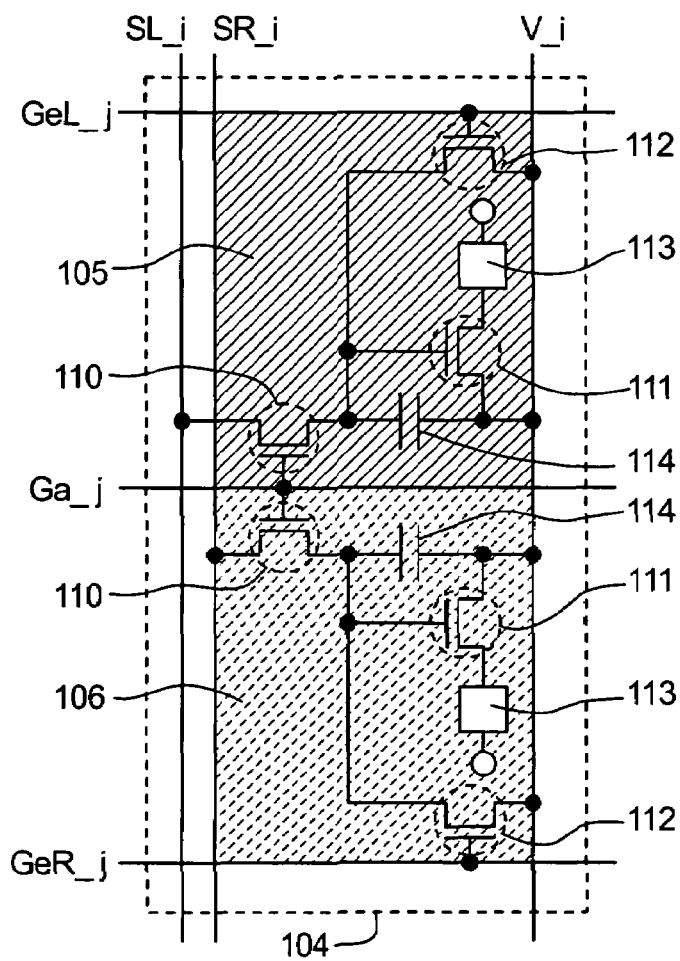

A circuit diagram of the pixel is shown in FIG. 1B. The first sub-pixel 105 and, the second sub-pixel 106 of the pixel 104 share one power supply line V_i (i is an arbitrary number ranging from 1 to x) and one writing gate signal line Ga_j (j is an arbitrary number ranging from 1 to y). A power supply line is not necessarily shared by all sub-pixels in one pixel. If a power supply line is not shared by all sub-pixels in one pixel, power supply lines of sub-pixels in one pixel have to be kept at the same electric potential.

The first sub-pixel 105 has a source signal line and the second sub-pixel 106 has another source signal line. In this embodiment mode, the source signal line of the first sub-pixel 105 is called a first source signal line SL_i (i is an arbitrary number ranging from 1 to x) and the source signal line of the second sub-pixel 106 is called a second source signal line SR_i (i is an arbitrary number ranging from 1 to x).

The first sub-pixel 105 has an erasing gate signal line and the second sub-pixel 106 has another erasing gate signal line. In this embodiment mode, the erasing gate signal line of the first sub-pixel 105 is called a first erasing gate signal line GeL_j (j is an arbitrary number ranging from 1 to y) and the erasing gate signal line of the second sub-pixel 106 is called a second erasing gate signal line GeR_j (j is an arbitrary number ranging from 1 to y).

The sub-pixels each have a switching TFT (first TFT) 110, a driving TFT (second TFT) 111, an erasing TFT (third TFT) 112, a light emitting element 113, and a capacitor 114.

The switching TFT 110 of each sub-pixel has a gate electrode connected to the writing gate signal line Ga_j. In each sub-pixel, the switching TFT 110 has a source region and a drain region one of which is connected to the source signal line of the sub-pixel and the other of which is connected to a gate electrode of the driving TFT 111 of the sub-pixel. In this embodiment mode, the switching TFT 110 of the first sub-pixel 105 has a source region and a drain region one of which is connected to the first source signal line SL_i and the other of which is connected to a gate electrode of the driving TFT 111 of the first sub-pixel 105. The switching TFT 110 of the second sub-pixel 106 has a source region and a drain region one of which is connected to the second source signal line SR_i and the other of which is connected to a gate electrode of the driving TFT 111 of the second sub-pixel 106.

In each sub-pixel, a source region of the driving TFT 111 is connected to the power supply line V_i and a drain region of the driving TFT is connected to a pixel electrode of the light emitting element 113 of the sub-pixel.

In each sub-pixel, the erasing TFT 112 is connected to the erasing gate signal line of the sub-pixel. In this embodiment mode, a gate electrode of the erasing TFT 112 of the first sub-pixel 105 is connected to the first erasing gate signal line GeL_j and a gate electrode of the erasing TFT 112 of the second sub-pixel 106 is connected to the second erasing gate signal line GeR_j.

In each sub-pixel, the erasing TFT 112 has a source region and a drain region one of which is connected to the power supply line V_i and the other of which is connected to the gate electrode of the driving TFT 111 of the sub-pixel.

Figure 2:
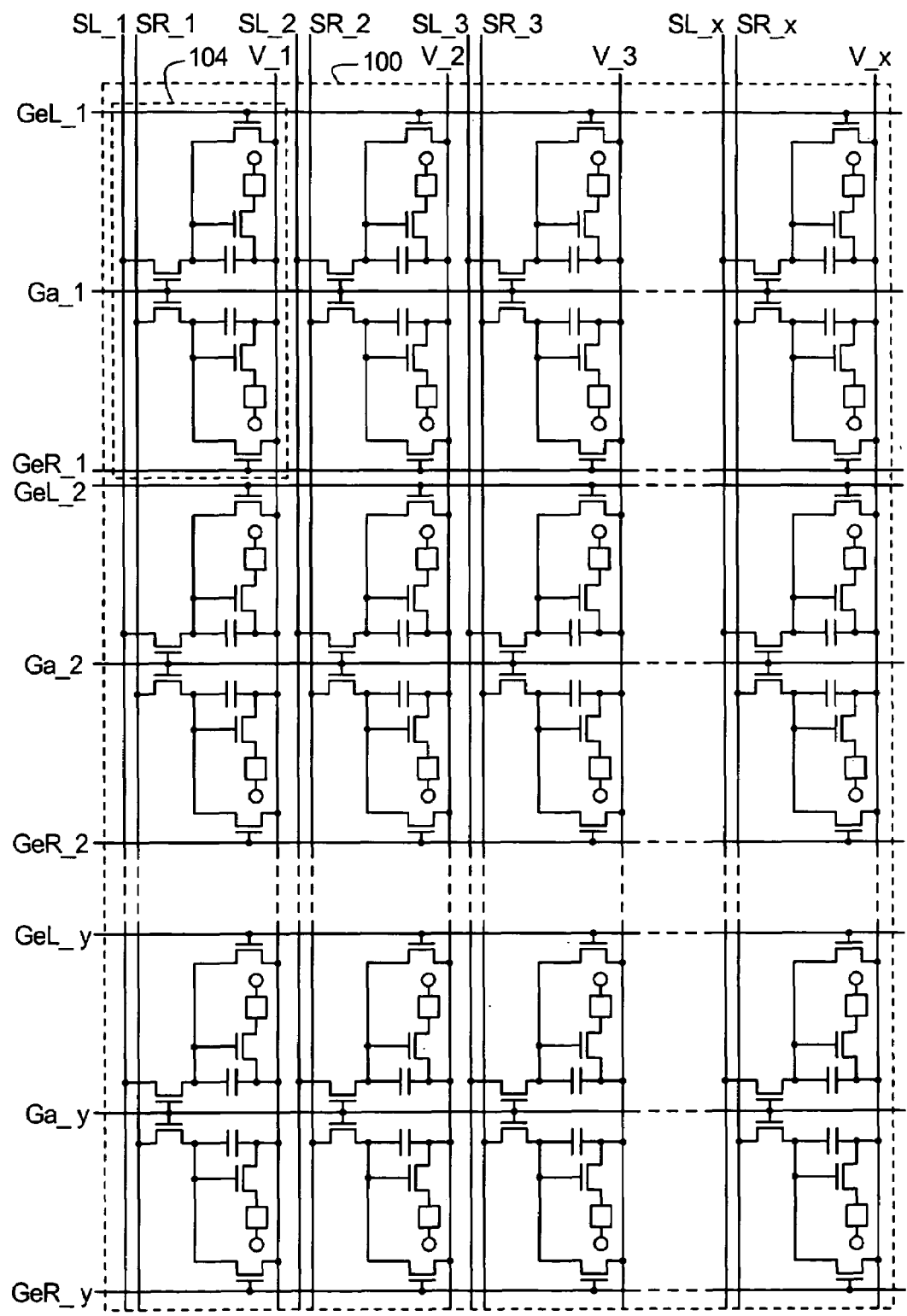
FIG. 2 is a circuit diagram of a pixel portion in a light emitting device of the present invention.

FIG. 2 is a circuit diagram of the pixel portion 100 shown in FIG. 1A. The pixel portion 100 is provided with first source signal lines SL_1 to SL_x, second source signal lines SR_1 to SR_x, power supply lines V_1 to V_x, writing gate signal lines Ga_1 to Ga_y, first erasing gate signal lines GeL_1 to GeL_y, and second erasing gate signal lines GeR_1 to GeR_y.

The number of first source signal lines and the number of power supply lines in the pixel portion 100 may not always match. The number of second source signal lines and the number of power supply lines in the pixel portion 100 may not always match. The number of writing gate signal lines and the number of first erasing gate signal lines in the pixel portion 100 may not always match. The number of writing gate signal lines and the number of second erasing gate signal lines in the pixel portion 100 may not always match.

Described next is a method of driving the light emitting device of the present invention which has the structure shown in FIGS. 1A and 1B and FIG. 2. The description given in this embodiment mode takes as an example a case where 6 bit digital video signals are used to display images. However, the bit number of digital video signals used in the light emitting device of the present invention is not limited thereto.

Figure 3:
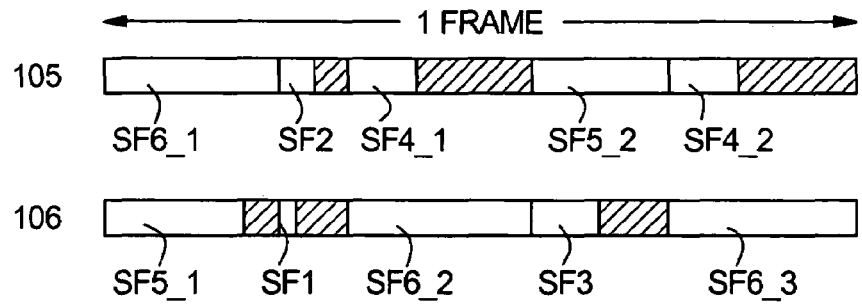
FIG. 3 is a diagram showing points (timings) at which sub-frame periods are started in sub-pixels of the present invention.

FIG. 3 shows points at which sub-frame periods are started in the first sub-pixel 105 and the second sub-pixel 106 of each pixel 104. In the first sub-pixel 105, sub-frame periods SF6_1, SF2, SF4_1, SF5_2, and SF4_2 are started in this order in one frame period. In the second sub-pixel 106, sub-frame periods SF5_1, SF1, SF6_2, SF3, and SF6_3 are started in this order in one frame period.

The sub-frame periods SF1 to SF3 are for the first set of one bit digital video signals to the third set of one bit digital video signals, respectively. The sub-frame periods SF4_1 and SF4_2 are both for the fourth set of one bit digital video signals. The sub-frame periods SF5_1 and SF5_2 are both for the fifth set of one bit digital video signals. The sub-frame periods SF6_1, SF6_2, and SF6_3 are all for the sixth set of one bit digital video signals.

Start of the sub-frame period SF6_1 in the first sub-pixel 105 coincides with start of the sub-frame period SF5_1 in the second sub-pixel 106. Similarly, start of the sub-frame period SF2 in the first sub-pixel 105 coincides with start of the sub-frame period SF1 in the second sub-pixel 106. Similarly, start of the sub-frame period SF4_1 in the first sub-pixel 105 coincides with start of the sub-frame period SF6_2 in the second sub-pixel 106. Similarly, start of the sub-frame period SF5_2 in the first sub-pixel 105 coincides with start of the sub-frame period SF3 in the second sub-pixel 106. Similarly, start of the sub-frame period SF4_2 in the first sub-pixel 105 coincides with start of the sub-frame period SF6_3 in the second sub-pixel 106.

Table 1 shows the order of starting sub-frame periods in the respective sub-pixels and the ratio of lengths of the sub-frame periods. In Table 1, parentheses represent the ratio of the length of that sub-frame period to the lengths of other sub-frame periods.

TABLE 1

(including 6 bit division)

| sub-pixel 1 | SF6_1(10) | SF2(2) | SF4_1(4) | SF5_2(8) | SF4_2(4) |
|---|---|---|---|---|---|
| sub-pixel 2 | SF5_1(8) | SF1(1) | SF6_2(11) | SF3(4) | SF6_3(11) |

In this embodiment mode, SF1:SF2:SF3:(SF4_1+SF4_2): (SF5_1+SF5_2):(SF6_1+SF6_2+SF6_3)=:$2^0$:$2^1$:$2^2$:$2^3$:$2^4$: $2^5$. Digital video signals determine which sub-frame period a light emitting element emits light in, and a desired gradation out of $2^6$ gradations can be obtained for a light emitting element by combining sub-frame periods during which the light emitting element emits light. When the device is driven using n bit digital video signals, the ratio of lengths of sub-frame periods for the respective bits is set to $2^0$:$2^1$:....:$2^{(n-1)}$.

The order of starting sub-frame periods and which sub-frame period in each sub-pixel is for which bit can be set suitably by a designer.

In this embodiment mode, the sub-frame period for the fourth set of one bit digital video signals is divided into two, SF4_1 and SF4_2. The sub-frame period for the fifth set of one bit digital video signals is divided into two, SF5_1 and SF5_2. The sub-frame period for the sixth set of one bit digital video signals is divided into three, SF6_1, SF6_2, and SF6_3. However, in the present invention, sub-frame periods that are to be divided are not limited to the sub-frame periods for the fourth, fifth, and sixth bits, and sub-frame periods for other bits may be divided instead.

The number of sub-frame periods to be divided may be one or more. However, it is preferable to select sub-frame periods for upper bits, namely, sub-frame periods having longer lengths, first as sub-frame periods to be divided.

The number of divisions of a sub-frame period can be set suitably by a designer. It is preferable to determine the number of divisions so as to balance the speed of driving the light emitting device with the required image display quality.

Desirably, divided sub-frame periods for digital video signals of the same bit have the same length. However, the present invention is not limited thereto and a sub-frame period may not always be equally divided.

The number of division may not be limited. When a sub-frame period is divided, another sub-frame period or a period in which no image is displayed (non-display period) may be interspersed between the divided sub-frame periods so as not to successively start the divided sub-frame periods in the same sub-pixel. In a non-display period, light emitting elements in all of the pixels in the pixel portion do not emit light.

The animation pseudocontour can be avoided by the above structure. However, the present invention is not limited to this structure and a sub-frame period is not necessarily divided.

Next, the operation of pixels in the respective sub-frame periods is described. As sub-frame periods are started, digital video signals are inputted to pixels in order until all of the pixels are provided with the digital video signals. Information of '1' or '0' of the digital video signals determines whether the light emitting elements of the first-sub-pixel 105 and the second sub-pixel 106 emit light or not.

To detail the above operation, writing gate signal lines of each of the pixels are selected in order. The writing gate signal lines are selected one by one and no two (or more) writing gate signal lines are selected simultaneously. For example, when the writing gate signal line Ga_j is selected, every switching TFT 110 whose gate electrode is connected to the writing gate signal line Ga_j is turned ON.

Then, digital video signals of the bits related to the respective sub-frame periods are inputted to all the source signal lines (the first source signal line and the second source signal line, in this embodiment mode). To be specific, the first set of one bit digital video signals to the third set of one bit digital video signals are inputted in SF1 to SF3, respectively. The fourth set of one bit digital video signals are inputted in SF4_1 and SF4_2. The fifth set of one bit digital video signals are inputted in SF5_1 and SF5_2. The sixth set of one bit digital video signals are inputted in SF6_1, SF6_2, and SF6_3. The first source signal line is provided with digital video signals of the bits related to the sub-frame periods that are started in the first sub-pixel. The second source signal line is provided with digital video signals of the bits related to the sub-frame periods that are started in the second sub-pixel.

In the pixel shown in FIG. 1B, digital video signals of the bits related to the sub-frame periods that are started in the first sub-pixel are inputted to the first source signal line SL_i. Digital video signals of the bits related to the sub-frame periods that are started in the second sub-pixel are inputted to the second source signal line SR_i.

In each of the sub-pixels, digital video signals are inputted to the gate electrode of the driving TFT 111 through the switching TFT 110 that is ON. Switching of the driving TFT 111 is controlled by the inputted digital video signals.

When the driving TFT 111 is turned ON, the electric potential of the power supply line (power supply electric potential) is given to the pixel electrode of the light emitting element 113 through the driving TFT 111. Accordingly, the difference in electric potential between the power supply electric potential and the opposite electric potential (light emitting element drive voltage) is applied to an organic compound layer of the light emitting element 113 to cause the light emitting element 113 to emit light.

On the other hand, when the driving TFT 111 is turned OFF, the power supply electric potential is not given to the pixel electrode of the light emitting element 113. Accordingly, the light emitting element drive voltage is not applied to the organic compound layer and thus the light emitting element 113 does not emit light.

The above operation is conducted in all of the pixels to input digital video signals to all of the pixels, sub-pixels, more concretely. In this specification, inputting a digital video signal to a pixel or sub-pixel means giving an electric potential of the digital video signal to a gate electrode of a driving TFT of the pixel or the sub-pixel. A period required to write digital video signals in all pixels is called herein a writing period Ta.

Before the writing period Ta is ended, or after it is ended, the first erasing gate signal line or the second erasing gate signal line is selected. When the first erasing gate signal line is selected, every erasing TFT 112 of the first sub-pixel 105 whose gate electrode is connected to the first erasing gate signal line is turned ON to give the power supply electric potential to the gate electrode of the driving TFT 111 of the first sub-pixel 105. As a result, the electric potential of the gate electrode of the driving TFT 111 is equalized with the electric potential of the source region of the driving TFT 111 to turn the TFT OFF, and the light emitting element 113 of the first sub-pixel 105 stops emitting light. Thus, the sub-frame period in the first sub-pixel 105 is ended.

Similarly, when the second erasing gate signal line is selected, every erasing TFT 112 of the second sub-pixel 106 whose gate electrode is connected to the second erasing gate signal line is turned ON to give the power supply electric potential to the gate electrode of the driving TFT 111 of the second sub-pixel 106. As a result, the electric potential of the gate electrode of the driving TFT 111 is equalized with the electric potential of the source region of the driving TFT 111 to turn the TFT OFF, and the light emitting element 113 of the second sub-pixel 106 stops emitting light. Thus, the sub-frame period in the second sub-pixel 106 is ended.

The first erasing gate signal line and the second erasing gate signal line in the same pixel are not always selected concurrently. Which points the first erasing gate signal line and the second erasing gate signal line are selected at are determined by lengths of sub-frame periods in the respective sub-pixels.

In this specification, a period required to finish selecting all the first erasing gate signal lines, or a period required to finish selecting all the second erasing gate signal lines is called an erasing period Te. The first erasing gate signal lines are selected one by one and no two (or more) lines are selected simultaneously. Similarly, the second erasing gate signal lines are selected one by one and no two (or more) lines are selected simultaneously.

Figure 4A:
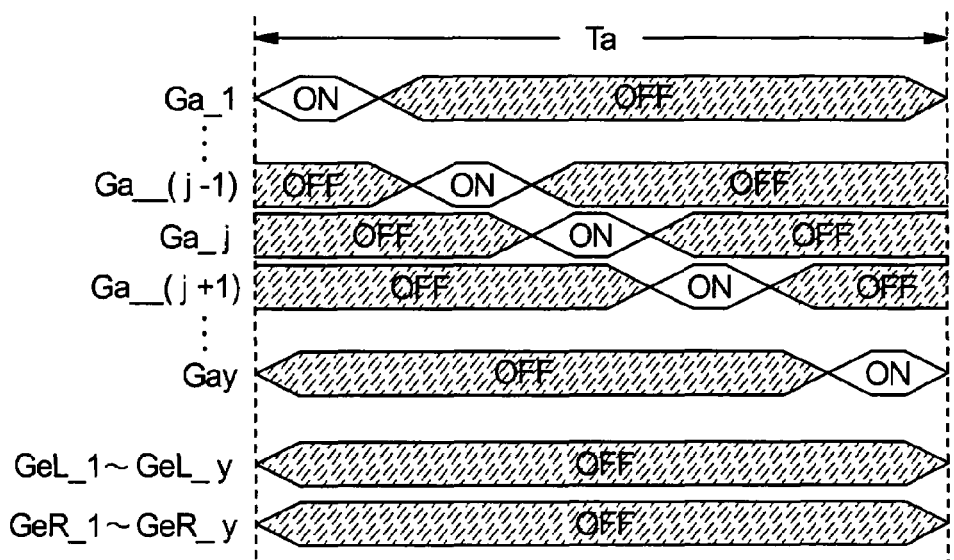
FIGS. 4A and 4B are timing charts of a writing gate signal line and first and second erasing gate signal lines of the present invention.
Figure 4B:
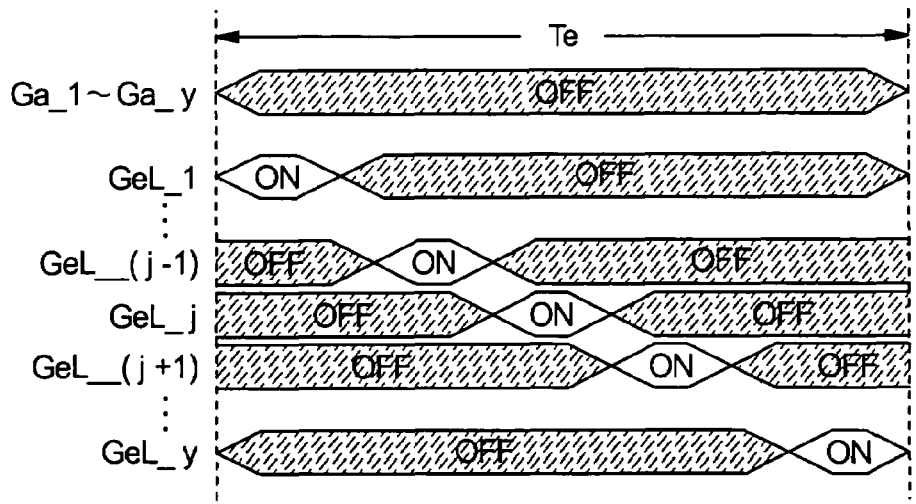

FIG. 4A shows points at which writing gate signal lines are selected in a writing period Ta. FIG. 4B shows points at which first erasing gate signal lines are selected in an erasing period Te of the first sub-pixel 105. Points at which second erasing gate signal lines are selected in an erasing period of the second sub-pixel 106 is the same as the first sub-pixel 105. Therefore, see FIG. 4B for the case of the second sub-pixel 106.

A light emitting element of a sub-pixel that has finished the sub-frame period first among plural sub-pixels of the same pixel does not emit light while the other sub-pixels finish the sub-frame period. After all the sub-pixels in the same pixel finish the sub-frame period, the next sub-frame period is started at once in all the sub-pixels of that pixel. A period from the end of a preceding sub-frame period to the start of the next sub-frame period, during which a light emitting element does not emit light, is called a non-display period BF.

By dividing sub-frame periods, the difference in length between sub-frame periods can be reduced. It is thus possible to reduce the difference in length between sub-frame periods that are simultaneously started in each of the plural sub-pixel of the same pixel, thereby shortening the length of the non-display period in one frame period and enhancing the contrast.

In the operation described above, when the sub-frame period is longer than the writing period, in other words, if the sub-frame period ends after the writing period Ta is ended, the next sub-frame period may be started without selecting the first erasing gate signal line or the second erasing gate signal line. In this case, the non-display period BF is not provided between the sub-frame periods.

Figure 5:
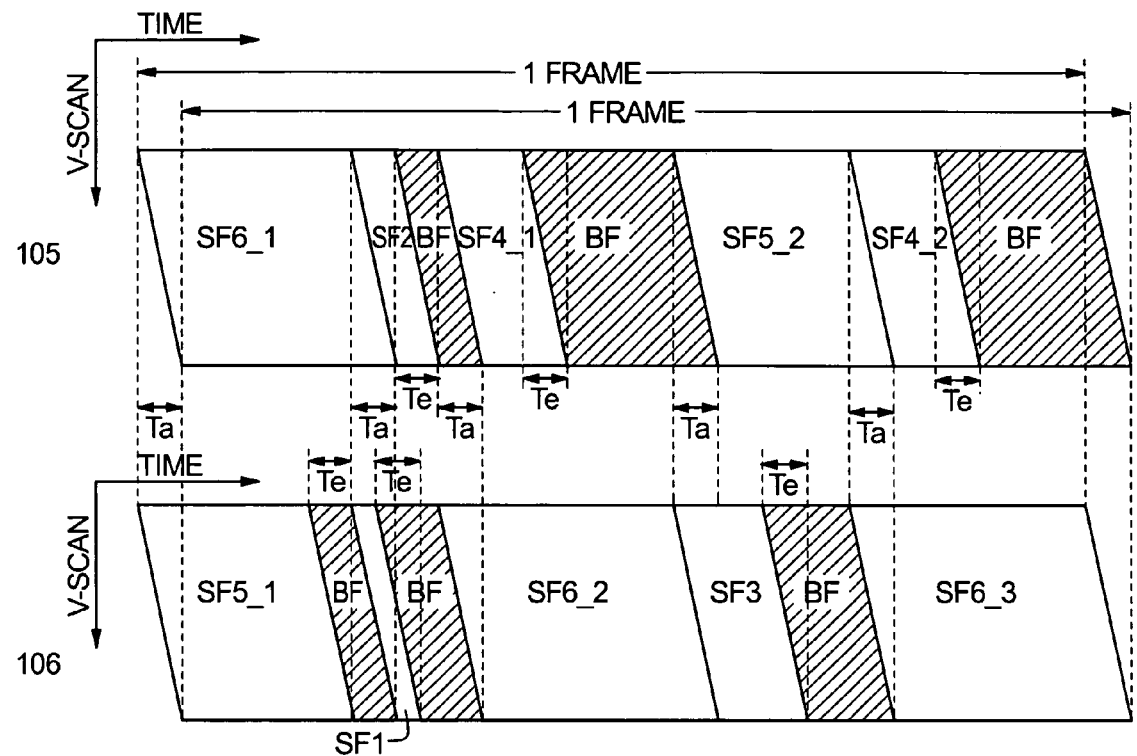
FIG. 5 is a diagram showing points (timings) at which sub-frame periods are started in a pixel portion of the present invention.

Points at which sub-frame periods are started arc different for pixels of different lines. In the present invention, one line of pixels have the same writing gate signal line. FIG. 5 shows points at which sub-frame periods are started for pixels of the respective lines. The axis of abscissa indicates the time scale whereas the axis of ordinate indicates positions of writing gate signal lines.

A period from the start of the sub-frame period in pixels of the first line to the start of the sub-frame period in pixels of the last line corresponds to the writing period Ta. A period from the start of the non-display period in pixels of the first line to the start of the non-display period in pixels of the last line corresponds to the erasing period Te. In this embodiment mode, non-display periods are provided immediately after the sub-frame periods SF2, SF4_1, SF4_2, SF5_1, SF1, and SF3 are ended. Non-display periods in the present invention are not always started immediately after the above sub-frame periods are ended. At least, however, a non display period is provided immediately after a sub-frame period that is shorter than a writing period.

Figure 17A:
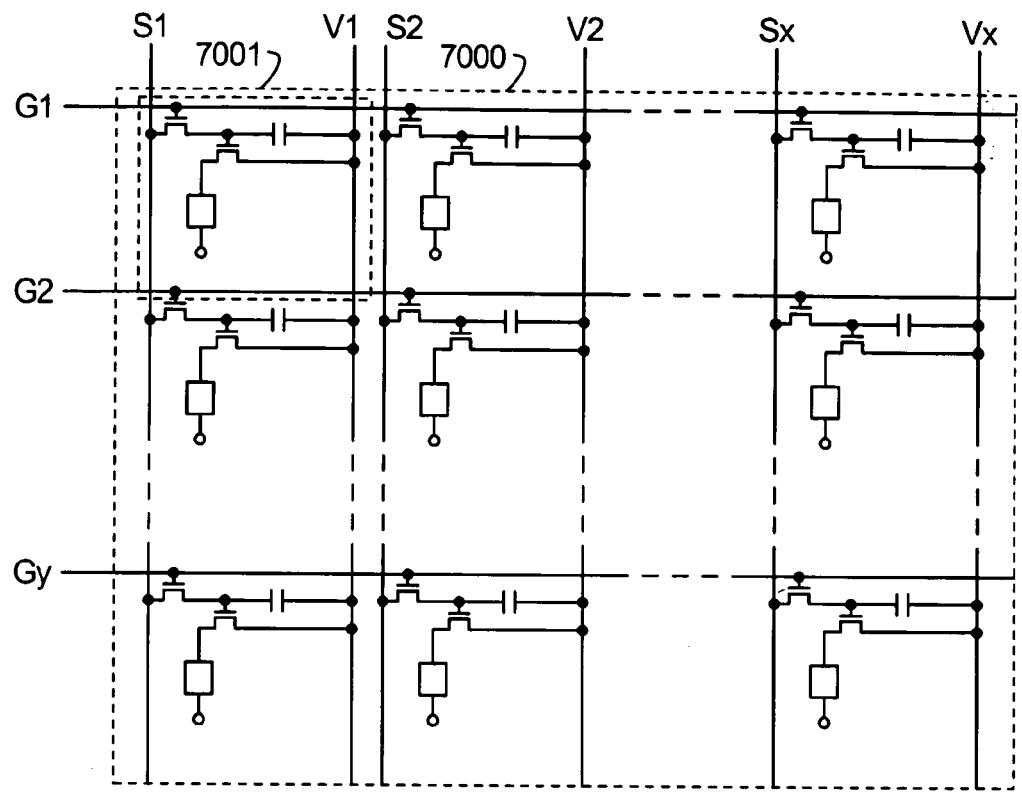
FIGS. 17A and 17B are circuit diagrams of a pixel portion and a pixel in a conventional light emitting device.
Figure 17B:
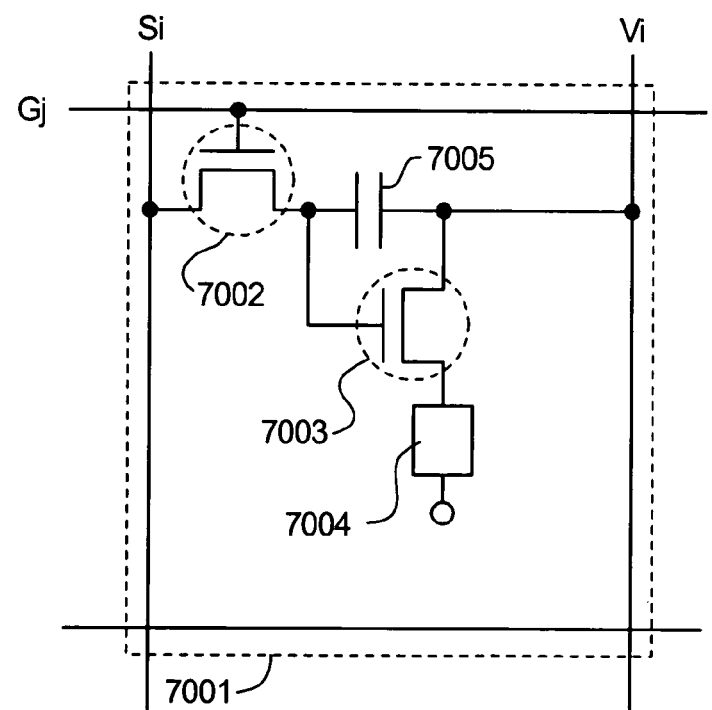
Figure 18:
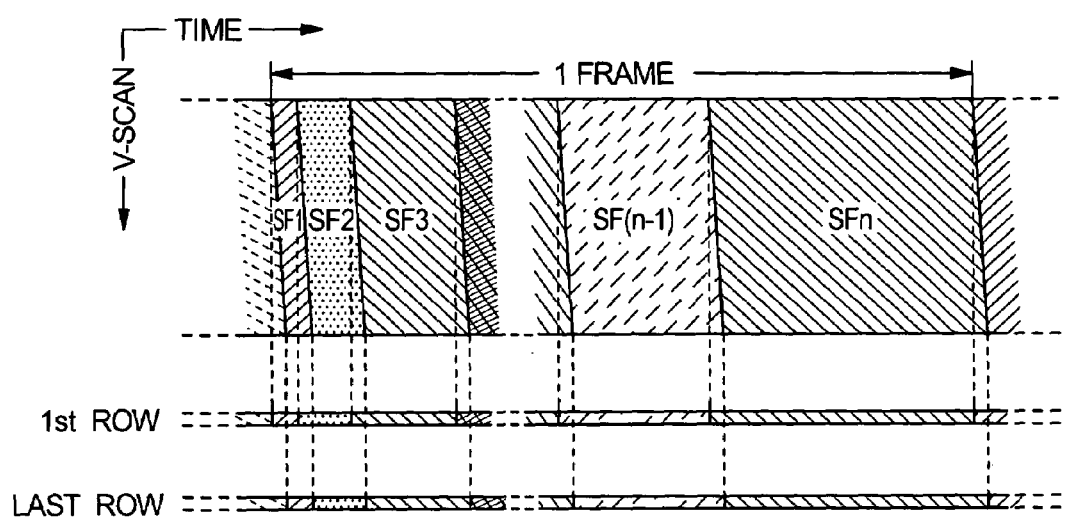
FIG. 18 is a diagram showing points (timings) at which sub-frame periods are started in the conventional light emitting device.
Figure 19A:
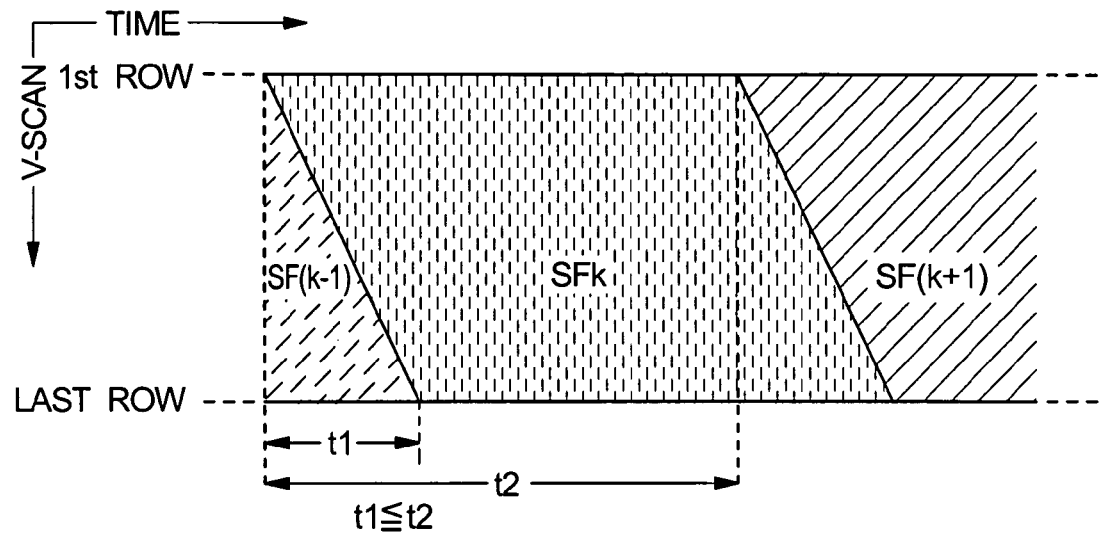
FIGS. 19A and 19B are diagrams showing points at which sub-frame periods are started in the conventional light emitting device.
Figure 19B:
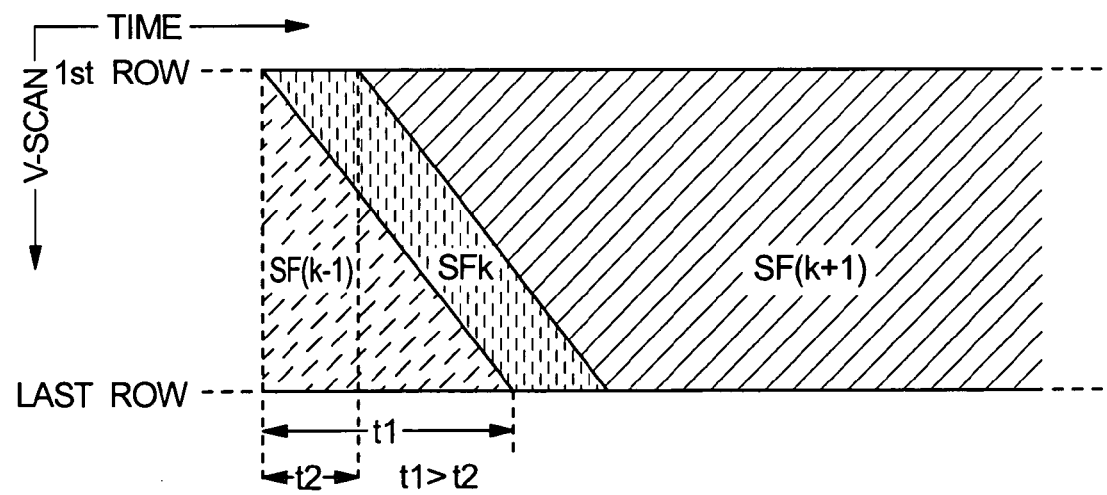

In the light emitting device of the present invention, the non-display period BF is provided by providing each sub-pixel with the erasing TFT 112. Therefore, unlike the general light emitting device shown in FIGS. 17A and 17B, a sub-frame period can be shorter than a period required to input digital video signals equivalent to one bit to every pixel (corresponding to the length of the writing period in the light emitting device of the present invention).

Figure 6:
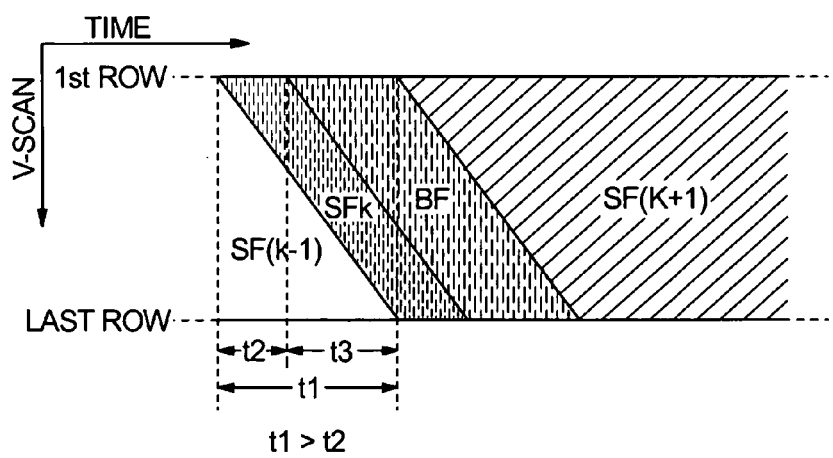
FIG. 6 is a diagram showing points (timings) at which sub-frame periods are started in a pixel portion of the present invention.

FIG. 6 shows points at which sub-frame periods SF(k−1), SFk, and SF(k+1) (k is an arbitrary natural number) are started when the light emitting device of the present invention displays an image by a time division driving method. The axis of abscissa indicates the time scale whereas the axis of ordinate indicates positions of pixels of the respective lines. Reference symbol t1 denotes the length of the writing period during which digital video signals equivalent to one bit are inputted to every pixel in the sub-frame period SFk, and t2 denotes the length of the sub-frame period SFk for pixels in the respective lines. One line of pixels have the same gate signal line.

Denoted by t3 is the length of the non-display period BF in pixels of the respective lines. It is important to set the length t3 of the non display period such that the writing period overlapping SFk does not overlap the writing period overlapping SF(k+1). In short, satisfying $t3 \geq t1-t2$ is important.

The above operation eliminates the need to start inputting the next set of one bit digital video signals to pixels while the previous set of one bit digital video signal are inputted to pixels in the same pixel portion when the sub-frame period t2 is shortened until t1>t2 is satisfied in order to increase the gradation number.

In the light emitting device of the present invention, gradation display is obtained by choosing which sub-frame periods of plural sub-pixels in a pixel light emitting elements of the sub-pixels emit light in. Accordingly, compared to a case of driving a general light emitting device with no sub-pixel by a time division driving, sub-frame periods are prevented from being shortened. An increase in drive frequency of the source signal line driving circuit thus can be avoided even when sub-frame periods are increased in number. Therefore, the present invention can display a high gradation image while avoiding lowering of frame frequency and too high drive frequency of the source signal line driving circuit.

The invention is also capable of displaying, an image with no noticeable animation pseudocontour while avoiding lowering of frame frequency and too high drive frequency of the source signal line driving circuit.

Embodiments of the present invention will be described below.

Embodiment 1

Figure 7:
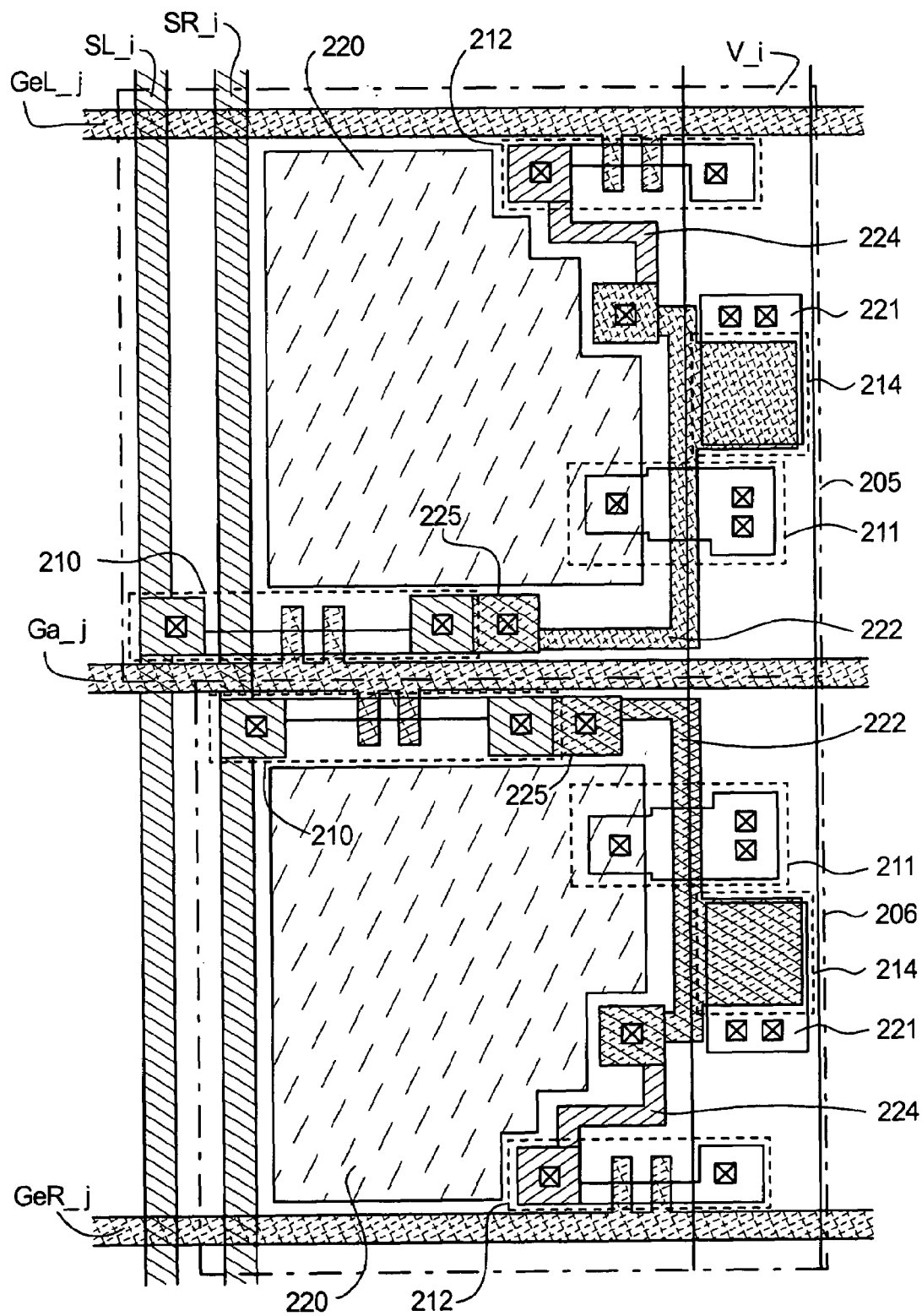
FIG. 7 is a top view of a pixel in a light emitting device of Embodiment 1.

This embodiment gives a description on the top view in FIG. 1B that shows the pixel of the light emitting device according to the present invention. FIG. 7 is a top view of a pixel of this embodiment.

Denoted by 205 and 206 are a first sub-pixel and a second sub-pixel, respectively. Each of the sub-pixels is provided with a switching TFT 210, a driving TFT 211, and an erasing TFT 212.

The first sub-pixel 205 and the second sub-pixel 206 share a writing gate signal line Ga_j and a power supply line V_i. The first sub-pixel 205 has a first erasing gate signal line GeL_j. The second sub-pixel 206 has a second erasing gate signal line GeR_j.

In each sub-pixel, the switching TFT 210 has a source region and a drain region one of which is connected to the source signal line of the sub-pixel and the other of which is connected to a gate wiring line 222 through a connection wiring line 225. A part of the gate wiring line 222 is used as a gate electrode of the driving TFT 211.

A source region of the driving TFT 211 is connected to the power supply line V_i and a drain region of the driving TFT 211 is connected to a pixel electrode 220 of a light emitting element. In this embodiment, though not shown in the drawing, an organic compound layer is formed such that it is in contact with the pixel electrode and an opposite electrode is formed such that it is in contact with the organic compound layer.

The gate wiring line 222 is formed in the same layer as the writing gate signal line and the erasing gate signal line. The gate wiring line 222 overlaps a capacitance active layer 221 with a gate insulating film (not shown) interposed therebetween. The capacitance active layer 221 is formed in the same layer as the active layer of the TFT. The capacitor active layer 221 is connected to the power supply line V_i to receive the power supply electric potential. The gate wiring line 222 and the capacitance active layer 221 constitute a capacitor 214.

The gate wiring line 222 also overlaps the power supply line V_i with an interlayer insulating film (not shown) interposed therebetween. A capacitance formed between the gate wiring line 222 and the power supply line V_i is used to keep the electric potential of the gate electrode of the driving TFT 211.

The erasing TFT 212 has a source region and a drain region one of which is connected to the gate wiring line 222 through a connection wiring line 224 and the other of which is connected to the power supply line V_i. The connection wiring lines 225 and 224 are formed in the same layer as the source signal line and the power supply line.

In each sub-pixel, a gate electrode of the erasing TFT 212 is connected to the erasing gate signal line of the sub-pixel.

This embodiment is merely an example and the light emitting device of the present invention is not limited to the structure shown in this embodiment.

Embodiment 2

This embodiment describes a case in which the light emitting device structured as shown in FIG. 1B in accordance with the present invention displays images using 6 bit digital video signals. In the example described, an image is displayed by using as many sub-frame periods as the bit number of the digital video signals instead of dividing a sub-frame period.

Table 2 shows the order of starting sub-frame periods in the respective sub-pixels and the ratio of lengths of the sub-frame periods. In Table 2, parentheses represent the ratio of the length of that sub-frame period to the lengths of other sub-frame periods.

TABLE 2

| (6 bit) | | | |
| --- | --- | --- | --- |
| sub-pixel 1 | SF6(32) | SF3(4) | SF1(1) |
| sub-pixel 2 | SF5(16) | SF4(8) | SF2(2) |

In the first sub-pixel 105, sub-frame periods SF6, SF3, and SF1 are started in this order in one frame period. In the second sub-pixel 106, sub-frame periods SF5, SF4, and SF2 are started in this order in one frame period.

The sub-frame periods SF1 to SF6 are for the first set of one bit digital video signals to the sixth set of one bit digital video signals, respectively.

Start of the sub-frame period SF6 in the first sub-pixel 105 coincides with start of the sub-frame period SF5 in the second sub-pixel 106. Similarly, start of the sub-frame period SF3 in the first sub-pixel 105 coincides with start of the sub-frame period SF4 in the second sub-pixel 106. Similarly, start of the sub-frame period SF1 in the first sub-pixel 105 coincides with start of the sub-frame period SF2 in the second sub-pixel 106.

In this embodiment, $SF1:SF2:SF3:SF4:SF5:SF6=2^0:2^1:2^2:2^3:2^4:2^5$. A desired gradation out of $2^6$ gradations can be obtained by combining the sub-frame periods. When the device is driven using n bit digital video signals, the ratio of lengths of sub-frame periods for the respective bits is set to $2^0:2^1:\ldots:2^{(n-1)}$.

The order of starting sub-frame periods and which sub-frame period in a sub-pixel is for which bit can be set suitably by a designer.

In the light emitting device of the present invention, gradation display is obtained by choosing which sub-frame periods of plural sub-pixels in a pixel light emitting elements of the sub-pixels emit light in. Accordingly, compared to a case of driving a general light emitting device with no sub-pixel by a time division driving, sub-frame periods are prevented from being shortened. An increase in drive frequency of a source signal line driving circuit thus can be avoided even when sub-frame periods are increased in number. Therefore, the present invention can display a high gradation image while avoiding lowering of frame frequency and too high drive frequency of the source signal line driving circuit.

The present invention is not limited to 6 bit digital video signals. The bit number of digital video signals used can be set suitably by a designer.

This embodiment may be combined freely with Embodiment 1.

Embodiment 3

This embodiment describes a case in which the light emitting device structured as shown in FIG. 1B in accordance with the present invention displays images using 8 bit digital video signals.

Table 3 shows the order of starting sub-frame periods in the respective sub-pixels and the ratio of lengths of the sub-frame periods. In Table 2, parentheses represent the ratio of the length of that sub-frame period to the lengths of other sub-frame periods.

device is driven using n bit digital video signals, the ratio of lengths of sub-frame periods for the respective bits is set to $2^0:2^1: \ldots :2^{(n-1)}$.

The order of starting sub-frame periods and which sub-frame period in a sub-pixel is for which bit can be set suitably by a designer.

In this embodiment, the sub-frame period for the sixth set of one bit digital video signals is divided into two, SF6_1 and SF6_2. The sub-frame period for the seventh set of one bit digital video signals is divided into two, SF7_1 and SF7_2. The sub-frame period for the eighth set of one bit digital video signals is divided into three, SF8_1, SF8_2, and SF8_3. However, in the present invention, the bit number of the digital video signals corresponded to the divided sub-frame periods is not limited.

The number of sub-frame periods to be divided may be one or more. However it is preferable to select sub-frame periods for upper bits, namely, sub-frame periods having longer lengths, first as sub-frame periods to be divided.

The number of divisions of a sub-frame period can be set suitably by a designer. It is preferable to determine the number of divisions so as to balance the speed of driving the light emitting device with the required image display quality.

TABLE 3

| | (including 8 bit division) | | | | |
|---|---|---|---|---|---|
| sub-pixel 1 | SF8_1(42) | SF2(2) | SF6_1(16) | SF7_2(32) | SF8_3(43) | SF1(1) |
| sub-pixel 2 | SF4(8) | SF7_1(32) | SF8_2(43) | SF3(4) | SF5(16) | SF6_2(16) |

In the first sub-pixel 105, sub-frame periods SF8_1, SF2, SF6_1, SF7_2, SF8_3, and SF1 are started in this order in one frame period. In the second sub-pixel 106, sub-frame periods SF4, SF7_1, SF8_2, SF3, SF5, and SF6_2 are started in this order in one frame period.

The sub-frame periods SF1 to SF5 are for the first set of one bit digital video signals to the fifth set of one bit digital video signals, respectively. The sub-frame periods SF6_1 and SF6_2 are both for the sixth set of one bit digital video signals. The sub-frame periods SF7_1 and SF7_2 are both for the seventh set of one bit digital video signals. The sub-frame periods SF8_1, SF8_2, and SF8_3 are all for the eighth set of one bit digital video signals.

Start of the sub-frame period SF8_1 in the first sub-pixel 105 coincides with start of the sub-frame period SF4 in the second sub-pixel 106. Similarly, start of the sub-frame period SF2 in the first sub-pixel 105 coincides with start of the sub-frame period SF7_1 in the second sub-pixel 106. Similarly, start of the sub-frame period SF6_1 in the first sub-pixel 105 coincides with start of the sub-frame period SF8_2 in the second sub-pixel 106. Similarly, start of the sub-frame period SF7_2 in the first sub-pixel 105 coincides with start of the sub-frame period SF3 in the second sub-pixel 106. Similarly, start of the sub-frame period SF8_3 in the first sub-pixel 105 coincides with start of the sub-frame period SF5 in the second sub-pixel 106. Similarly, start of the sub-frame period SF1 in the first sub-pixel 105 coincides with start of the sub-frame period SF6_2 in the second sub-pixel 106.

In this embodiment, SF1:SF2:SF3:SF4:SF5:(SF6_1+SF6_2):(SF7_1+SF7_2):(SF8_1+SF8_2+SF8_3)=$2^0:2^1:2^2:2^3:2^4:2^5:2^6:2^7$. A desired gradation out of $2^8$ gradations can be obtained by combining the sub-frame periods. When the Desirably, divided sub-frame periods for digital video signals of the same bit have the same length. However, the present invention is not limited thereto and a sub-frame period may not always be divided equally.

In addition, the number of division may not be limited. When a sub-frame period is divided, another sub-frame period or a period in which no image is displayed (non-display period) may he interspersed between the divided sub-frame periods so as not to successively start the divided sub-frame periods in the same sub-pixel. In a non-display period, light emitting elements in all of the pixels in the pixel portion do not emit light.

The animation pseudocontour can be avoided by the above structure. However, the present invention is not limited to this structure and a sub-frame period is not necessarily divided.

By dividing sub-frame periods, the difference in length between sub-frame periods can be reduced. It is thus possible to reduce the difference in length between sub-frame periods that are simultaneously started in each of the plural sub-pixels of the same pixel, thereby shortening the length of a non-display period in one frame period and enhancing the contrast.

In the light emitting device of the present invention, gradation display is obtained by choosing which sub-frame periods of plural sub-pixels in a pixel light emitting elements of the sub-pixels emit light in. Accordingly, compared to a case of driving a general light emitting device with no sub-pixel by a time division driving, sub-frame periods are prevented from being shortened. An increase in drive frequency of a source signal line driving circuit thus can be avoided even when sub-frame periods are increased in number. Therefore, the present invention can display a high gradation image while avoiding lowering of frame frequency and too high drive frequency of the source signal line driving circuit.

The present invention is not limited to 8 bit digital video signals. The bit number of digital video signals used can be set suitably by a designer.

This embodiment may be combined freely with Embodiment 1.

Embodiment 4

This embodiment describes a case of switching sub-frame periods in the light emitting device structured as shown in FIG. 1B in accordance with the present invention. In the case described here, sub-frame periods of one sub-pixel and sub-frame periods of the other sub-pixel in one frame period are exchanged between the two sub-pixels in the next frame period.

Table 4 shows the order of starting sub-frame periods in the respective sub-pixels and the ratio of lengths of the sub-frame periods. In Table 1, parentheses represent the ratio of the length of that sub-frame period to the lengths of other sub-frame periods.

TABLE 4

| | (including reverse 4 bit division) | | | | | |
|---|---|---|---|---|---|---|
| | first frame period | | | second frame period | | |
| sub-pixel 1 | SF3(4) | SF1(1) | — | SF4_1(4) | SF2(2) | SF4_2(4) |
| sub-pixel 2 | SF4_1(4) | SF2(2) | SF4_2(4) | SF3(4) | SF 1(1) | — |

In the first sub-pixel 105, sub-frame periods SF3 and SF1 are started in this order in a first frame period that comes first. In the second sub-pixel 106, sub-frame periods SF4_1, SF2, and SF4_2 are started in this order in the first frame period.

In a second frame period that comes next, sub-frame periods SF4_1, SF2, and SF4_2 are started in this order in the first sub-pixel 105. In the second sub-pixel 106, sub-frame periods SF3 and SF1 are started in this order in the second frame period.

The sub-frame periods SF1 to SF3 are for the first set of one bit digital video signals to the third set of one bit digital video signals, respectively. The sub-frame periods SF4_1 and SF4_2 are both for the fourth set of one bit digital video signals.

Start of the sub-frame period SF3 coincides with start of the sub-frame period SF4_1. Start of the sub-frame period SF1 coincides with start of the sub-frame period SF2. While the sub-frame period SF4_2 is started in one sub-pixel, non-display period BF is started in the other sub-pixel.

In this embodiment, SF1:SF2:SF3:(SF4_1+SF4_2)=$2^0$:$2^1$:$2^2$:$2^3$. A desired gradation out of $2^4$ gradations can be obtained by combining the sub-frame periods.

In this embodiment, sub-frame periods of one sub-pixel and sub-frame periods of the other sub-pixel in one frame period are exchanged between the two sub-pixels in the next frame period. This makes it possible to equalize the length of the period in which a light emitting element of one sub-pixel emits light with the length of the period in which a light emitting element of the other sub-pixel emits light.

The order of starting sub-frame periods and which sub-frame period in a sub-pixel is for which bit can be set suitably by a designer in this embodiment.

In this embodiment, the sub-frame period for the fourth set of one bit digital video signals is divided into two, SF4_1 and SF4_2. However, in this embodiment, the bit number of the digital video signals corresponded to the divided sub-frame periods is not limited. Also, the number of division of a sub-frame period is not limited to two.

The number of sub-frame periods to be divided may be one or more. However, it is preferable to select sub-frame periods for upper bits, namely, sub-frame periods having longer lengths, first as sub-frame periods to be divided.

The number of divisions of a sub-frame period can be set suitably by a designer. It is preferable to determine the number of divisions so as to balance the speed of driving the light emitting device with the required image display quality.

The present invention is not limited to 4 bit digital video signals. The bit number of digital video signals used can be set suitably by a designer.

This embodiment may be combined freely with Embodiments 1 through 3.

Embodiment 5

This embodiment describes a pixel in a light emitting device of the present invention which has a structure different from the one shown in FIG. 1B. The description will be given with reference to FIG. 8.

Figure 8:
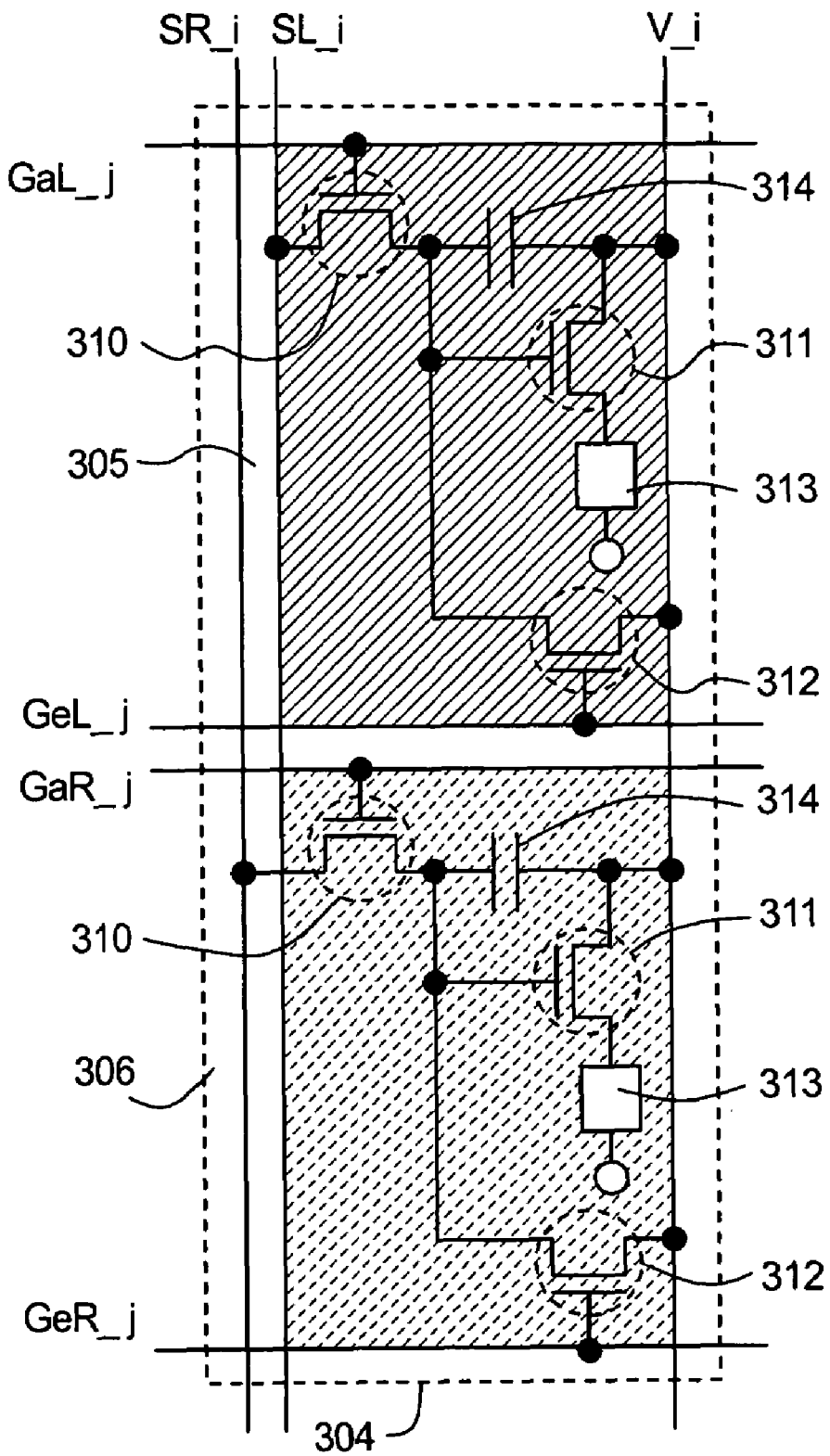
FIG. 8 is a circuit diagram of a pixel in a light emitting device of Embodiment 5.

FIG. 8 is a circuit diagram of a pixel of this embodiment. A pixel 304 has a first sub-pixel 305 and a second sub-pixel 306, which share one power supply line V_i (i is an arbitrary number ranging from 1 to x).

The first sub-pixel 305 has a source signal line and the second sub-pixel 306 has another source signal line. In this embodiment, the source signal line of the first sub-pixel 305 is called a first source signal line SL_i (i is an arbitrary number ranging from 1 to x) and the source signal line of the second sub-pixel 306 is called a second source signal line SR_i (i is an arbitrary number ranging from 1 to x).

The first sub-pixel 305 has a writing gate signal line and the second sub-pixel 306 has another writing gate signal line. In this embodiment, the writing gate signal line of the first sub-pixel 305 is called a first writing gate signal line GaL_j (j is an arbitrary number ranging from 1 to y) and the writing gate signal line of the second sub-pixel 306 is called a second writing gate signal line GaR_j (j is an arbitrary number ranging from 1 to y).

The first sub-pixel 305 has an erasing gate signal line and the second sub-pixel 306 has another erasing gate signal line. In this embodiment, erasing gate signal line of the first sub-pixel 305 is called a first erasing gate signal line GeL_j (j is an arbitrary, number ranging from 1 to y ) and the erasing gate signal line of the second sub-pixel 306 is called a second erasing gate signal line GeR_j (j is an arbitrary number ranging from 1 to y).

The sub-pixels each have a switching TFT 310, a driving TFT 311, an erasing TFT 312, a light emitting element 313, and a capacitor 314.

In each sub-pixel, the switching TFT 310 has a gate electrode connected to the writing gate signal line Ga_j of the sub-pixel. In this embodiment, the gate electrode of the switching TFT 310 of the first sub-pixel 305 is connected to the first writing gate signal line GaL_j. The gate electrode of the switching TFT 310 of the second sub-pixel 306 is connected to the second writing gate signal line GaR_j.

In each sub-pixel, the switching, TFT 310 has a source region and a drain region one of which is connected to the source signal line of the sub-pixel and the other of which is connected to a gate electrode of the driving TFT 311 of the sub-pixel. In this embodiment, the switching TFT 310 of the first sub-pixel 305 has a source region and a drain region one of which is connected to the first source signal line SL_i and the other of which is connected to a gate electrode of the driving TFT 311 of the first sub-pixel 305. The switching TFT 310 of the second sub-pixel 306 has a source region and a drain region one of which is connected to the second source signal line SR_i and the other of which is connected to a gate electrode of the driving TFT 311 of the second sub-pixel 306.

In each sub-pixel, a source region of the driving TFT 311 is connected to the power supply line V_i and a drain region of the driving, TFT 311 is connected to a pixel electrode of the light emitting element 313 of the sub-pixel.

In each sub-pixel, the erasing TFT 312 is connected to the erasing gate signal line of the sub-pixel. In this embodiment, a gate electrode of the erasing TFT 312 of the first sub-pixel 305 is connected to the first erasing gate signal line GeL_j and a gate electrode of the erasing TFT 312 of the second sub-pixel 306 is connected to the second erasing gate signal line GeR_j.

In each sub-pixel, the erasing TFT 312 has a source region and a drain region one of which is connected to the power supply line V_i and the other of which is connected to the gate electrode of the driving TFT 311 of the sub-pixel.

In this embodiment, the first writing gate signal line GaL_j and the second writing gate signal line GaR_j are selected at the same time in a writing period.

The number of switching TFTs connected to one writing gate signal line in this embodiment is half the number in the structure shown in FIG. 1B. Accordingly, load on a gate signal line is reduced and thus response speed upon selecting the gate signal line is raised.

This embodiment may be combined freely with Embodiment 1 through 4.

Embodiment 6

This embodiment describes a light emitting device of the present invention in which each pixel has three sub-pixels.

Figure 9A:
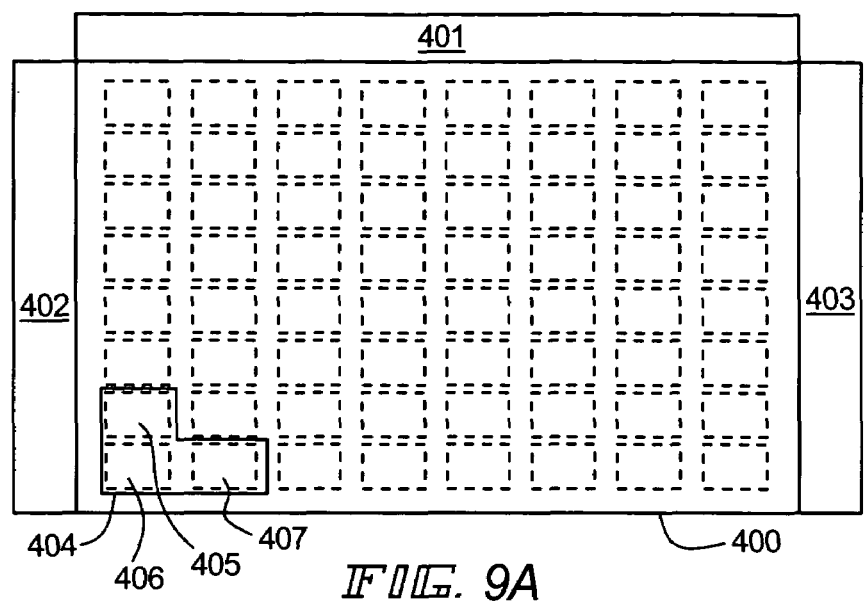
FIGS. 9A and 9B are a block diagram of a light emitting device and a circuit diagram of a pixel, respectively, of Embodiment 6.

The structure of the light emitting device of the present invention is described with reference to FIGS. 9A and 9B. FIG. 9A is a block diagram of a display panel included in the light emitting device of the present invention. On a substrate (not shown in the drawing), a pixel portion 400, a source signal line driving circuit 401, a writing gate signal line driving circuit 402, and an erasing gate signal line driving circuit 403 are provided.

The pixel portion 400 and a driving circuit group (including the source signal line driving circuit 401, the writing gate signal line driving circuit 402, and the erasing gate signal line driving circuit 403) are formed on the same substrate in this embodiment, but the present invention is not limited thereto. The pixel portion 400 and the driving circuit group may be formed on different substrates to be connected to each other through a connector such as an FPC.

Numbers of the source signal line driving circuit 401 and the gate signal line driving circuits (including the writing gate signal line driving circuit 402 and the erasing gate signal line driving circuit 403) are not limited to those shown in FIG. 9A. The number of the source signal line driving circuits 401 provided may be one or more. One or more gate signal line driving circuits may be provided, and one gate signal line driving circuit may substitute for the writing gate signal line drawing circuit 402 and the erasing gate signal line driving circuit 403.

In the pixel portion 400, a plurality of pixels form a matrix and each pixel 404 has a plurality of sub-pixels. Each pixel may have as many sub-pixels as can be formed. In this embodiment, one pixel 404 has three sub-pixels, namely, a first sub-pixel 405, a second sub-pixel 406, and a third sub-pixel 407.

Figure 9B:
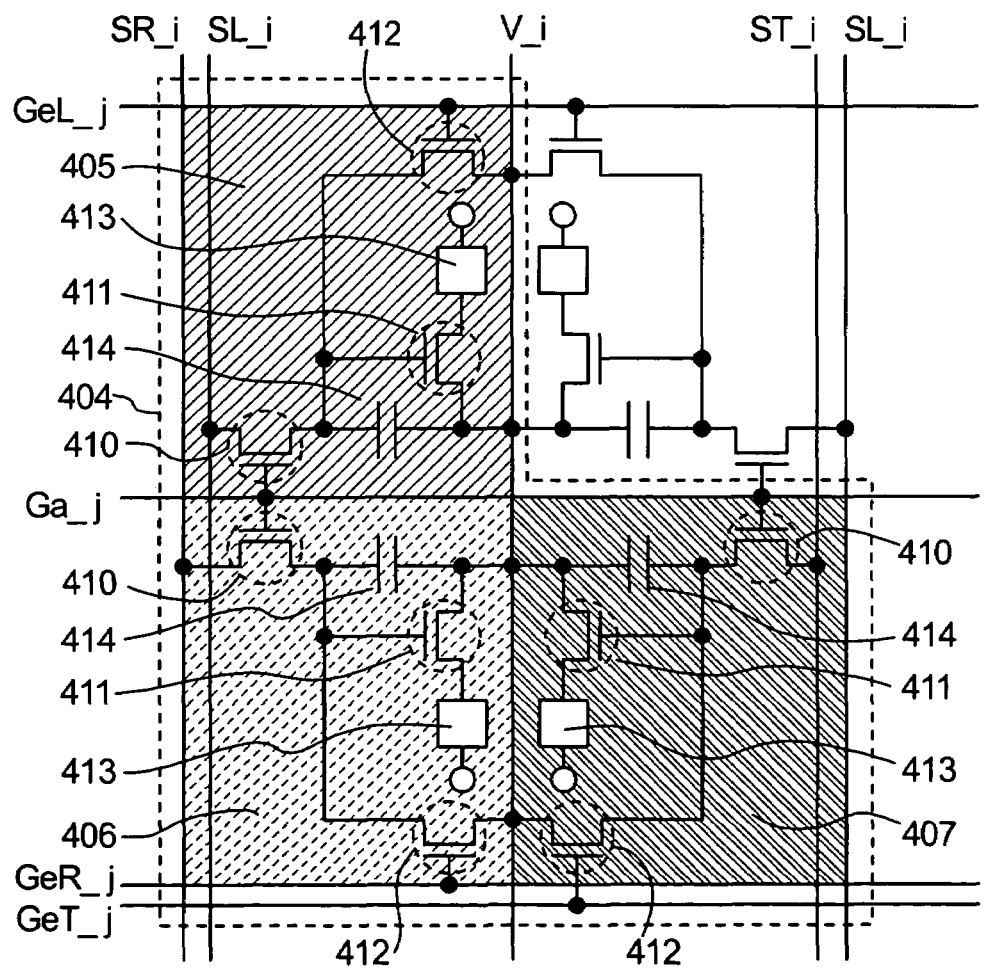

A circuit diagram of the pixel is shown in FIG. 9B. The first sub-pixel 405, the second sub-pixel 406, and the third sub-pixel 407 of the pixel 404 share one power supply line V_i (i is an arbitrary number ranging from 1 to x) and one writing gate signal line Ga_j (j is an arbitrary number ranging from 1 to y).

The first sub-pixel 405 has a source signal line, the second sub-pixel 406 has another source signal line, and the third sub-pixel 407 has still another source signal line. In this embodiment, the source signal line of the first sub-pixel 405 is called a first source signal line SL_i (i is an arbitrary number ranging from 1 to x), the source signal line of the second sub-pixel 406 is called a second source signal line SR_i (i is an arbitrary number ranging from 1 to x), and the source signal line of the third sub-pixel 407 is called a third source signal line ST_i (i is an arbitrary number ranging from 1 to x).

The first sub-pixel 405 has an erasing gate signal line, the second sub-pixel 406 has another erasing gate signal line, and the third sub-pixel 407 has still another erasing gate signal line. In this embodiment, the erasing gate signal line of the first sub-pixel 405 is called a first erasing gate signal line GeL_j is an arbitrary number ranging from 1 to y), the erasing gate signal line of the second sub-pixel 406 is called a second erasing gate signal line GeR_j (j is an arbitrary number ranging from 1 to y), and the erasing gate signal line of the third sub-pixel 407 is called a third erasing gate signal line GeT_j (j is an arbitrary number ranging from 1 to y).

The sub-pixels each have a switching TFT 410, a driving TFT 411, an erasing TFT 412, a light emitting element 413, and a capacitor 414.

The switching TFT 410 of each sub-pixel has a gate electrode connected to the writing gate signal line Ga_j. In each sub-pixel, the switching TFT 410 has a source region and a drain region one of which is connected to the source signal line of the sub-pixel and the other of which is connected to a gate electrode of the driving TFT 411 of the sub-pixel. In this embodiment, the switching TFT 410 of the first sub-pixel 405 has a source region and a drain region one of which is connected to the first source signal line SL_i and the other of which is connected to a gate electrode of the driving TFT 411 of the first sub-pixel 405. The switching TFT 410 of the second sub-pixel 406 has a source region and a drain region one of which is connected to the second source signal line SR_i and the other of which is connected to a gate electrode of the driving TFT 411 of the second sub-pixel 406. The switching TFT 410 of the third sub-pixel 407 has a source region and a drain region one of which is connected to the third source signal line ST_i and the other of which is connected to a gate electrode of the driving TFT 411 of the third sub-pixel 407.

In each sub-pixel, a source region of the driving TFT 411 is connected to the power supply line V_i and a drain region of the driving TFT 411 is connected to a pixel electrode of the light emitting element 413 of the sub-pixel.

In each sub-pixel, the erasing TFT 412 is connected to the erasing gate signal line of the sub-pixel. In this embodiment, a gate electrode of the erasing TFT 412 of the first sub-pixel 405 is connected to the first erasing gate signal line GeL_j, a gate electrode of the erasing TFT 412 of the second sub-pixel 406 is connected to the second erasing gate signal line GeR_j, and a gate electrode of the erasing TFT 412 of the third sub-pixel 407 is connected to the third erasing gate signal line GeT_j.

In each sub-pixel, the erasing TFT 412 has a source region and a drain region one of which is connected to the power supply line V_i and the other of which is connected to the gate electrode of the driving TFT 411 of the sub-pixel.

The number of sub-pixels in each pixel can be set at discretion in the present invention. As the number of sub-pixels is increased, lengths of sub-frame periods are reduced.

This embodiment may be combined freely with Embodiments 1 through 5.

Embodiment 7

This embodiment gives descriptions on detailed structures of a source signal line driving circuit, a writing gate signal line driving circuit, and an erasing gate signal line driving circuit, which constitute driving circuit group in a light emitting device of the present invention.

Figure 10A:
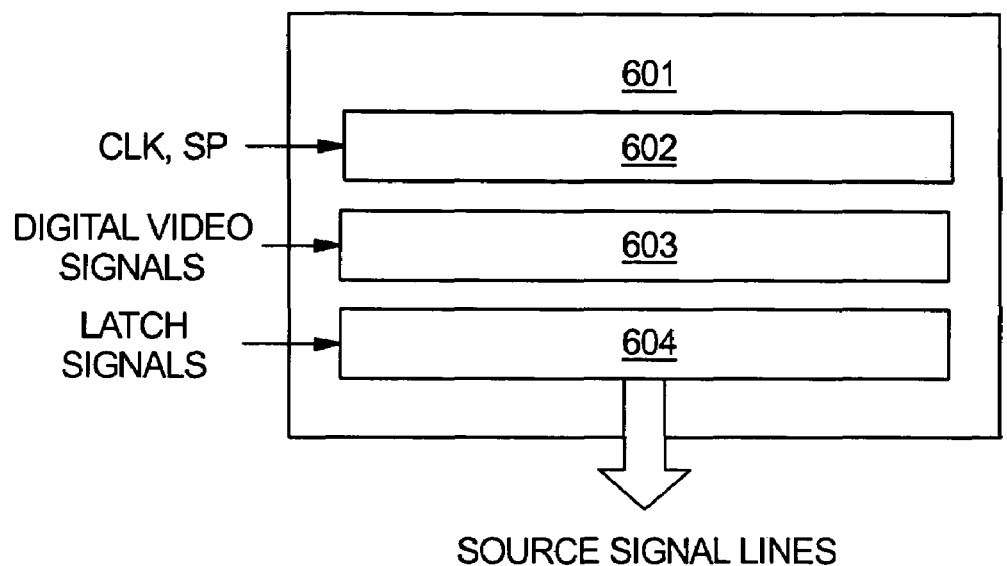
FIGS. 10A and 10B are block diagrams of driving circuit group in a light emitting device of Embodiment 7.
Figure 10B:
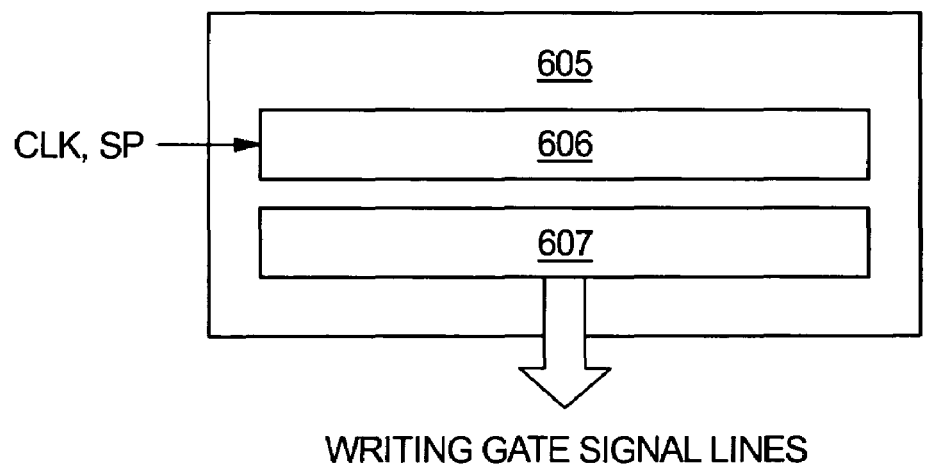

FIGS. 10A and 10B are block diagrams of driving circuits in a light emitting device of this embodiment. FIG. 10A shows a source signal line driving circuit 601, which has a shift register 602, a latch (A) 603, and a latch (B) 604.

In the source signal line driving circuit 601, clock signals (CLK) and start pulses (SP) are inputted to the shift register 602. The shift register 602 generates timing signals in order in response to these clock signals (CLK) and start pulses (SP) and successively inputs the timing signals to downstream circuits through a buffer (not shown) or the like.

The timing signals from the shift register 602 are buffered and amplified by a buffer or the like. A wiring line to which the timing signals are inputted is connected to many circuits or elements and therefore has large load capacitance (parasitic capacitance). A large load capacitance dulls rising or falling of the timing signals. The buffer is provided to avoid dulled rising or falling. However, the buffer is not indispensable.

The timing signals buffered and amplified by the buffer are inputted to the latch (A) 603. The latch (A) 603 has a plurality of stages of latches for processing n bit digital video signals. Upon receiving the timing signals, the latch (A) 603 successively takes in n bit digital video signals that are inputted from the external to the source signal line driving circuit 601, and holds them inside.

When the digital video signals are inputted to the latch (A) 603, the digital video signals may be inputted in order to the plural stages of latches of the latch (A) 603. However, the present invention is not limited thereto. The plural stages of latches of the latch (A) 603 may be divided into some (groups to conduct so-called division driving in which digital video signals are inputted concurrently to the respective groups. The number of groups is called the number of division. For example, when four stages of latches make one group, it is called four division driving.

A period required to finish writing digital video signals to all stages of latches in the latch (A) 603 is called a line period. In practice, the line period above plus a horizontal retrace period may be defined as a line period.

As one line period is ended, latch signals are inputted to the latch (B) 604. In this instant, the digital video signals that have been written and held in the latch (A) 603 are sent to the latch (B) 604 at once to be written and held in all stages of latches in the latch (B) 604.

After sending the digital video signals to the latch (B) 604, the latch (A) 603, based on timing signals from the shift register 602, digital video signals are written in the latch (A) 603 in order in response to the timing signals.

In this second time one line period, the digital video signals that have been written and held in the latch (B) 604 are inputted to source signal lines.

FIG. 10B is a block diagram showing the structure of the writing gate signal line driving circuit.

The writing gate signal line driving circuit 605 has a shift register 606 and a buffer 607. The circuit may have a level shifter in some cases.

In the writing gate signal line driving circuit 605, timing signals from the shift register 606 are inputted to the buffer 607 and then inputted to corresponding writing gate signal lines (including a first writing gate signal line and a second writing gate signal line). Each writing gate signal line is connected to gate electrodes of switching TFTs of one line of pixels. The switching TFTs of one line of pixels have to be turned ON at once, and therefore the buffer used is capable of causing a large amount of current to flow.

The erasing gate signal line driving circuit has the same structure as the writing gate signal line driving circuit, so see FIG. 10B. However, in the erasing gate signal line driving circuit, outputs from the buffer are inputted to erasing gate signal lines (including a first erasing gate signal line and a second erasing gate signal line). Each erasing gate signal line is connected to gate electrodes of erasing TFTs of one line of pixels. The erasing TFTs of one line of pixels have to be turned ON at once, and therefore the buffer used is capable of causing a large amount of current to flow.

This embodiment may be combined freely with Embodiments 1 through 6.

Embodiment 8

An example of a method of manufacturing a TFT of a light-emitting device of the present invention is described with reference to FIGS. 11A to 13B. A method of manufacturing simultaneously a switching TFT and a driving TFT provided in the pixel portion of the light-emitting device of the present invention, and the TFT of the driving portion provided in the vicinity of the pixel portion is described in detail according to processes. The explanation of manufacturing method of the erasing TFT is omitted here, because it can be manufactured by the same method of a switching TFT.

First, in this embodiment, a substrate 900 formed of glass such as barium borosilicate glass or aluminum borosilicate, represented by Corning #7059 glass and #1737 glass is prepared. Note that, as the substrate 900, a quartz substrate may be used as long as the substrate is a light transmission type. A plastic substrate having heat resistance to a process temperature of this embodiment may also be used.

Then, a base film 901 is formed from an insulating film such as a silicon oxide film, a silicon nitride film or a silicon nitride oxide film, on the substrate 900 as shown in FIG. 11A. In this embodiment, a two-layer structure is used for the base film 901. However, a single-layer film or a lamination film consisting of two or more layers of the above-mentioned insulating film may be used. As a first layer of the base film 901, a silicon nitride oxide film 901a is formed with a thickness of 10 to 200 nm (preferably 50 to 100 nm) using $SiH_4$, $NH_3$, and $N_2O$ as reaction gases by plasma CVD. In this embodiment, the silicon nitride oxide film 901a (composition ratio Si=32%, O=27%, N=24% and H=17%) having a film thickness of 50 nm is formed. Then, as a second layer of the base film 901, a silicon nitride oxide film 901b is formed so as to laminate thereon with a thickness of 50 to 200 nm (preferably 100 to 150 nm) using $SiH_4$ and $N_2O$ as reaction gases by plasma CVD. In this embodiment, the silicon nitride oxide film 901b (composition ratio Si=32%, O=59%, N=7% and H=2%) having a film thickness of 100 nm is formed.

Subsequently, semiconductor layers 902 to 905 are formed on the base film 901. The semiconductor layers 902 to 905 are formed such that a semiconductor film having an amorphous structure is formed by a known method (a sputtering method, an LPCVD method, or a plasma CVD method), and is subjected to a known crystallization process (a laser crystallization method, a thermal crystallization method, or a thermal crystallization method using a catalyst such as nickel and the like), and the crystalline semiconductor film thus obtained is patterned into desired shapes. The semiconductor layers 902 to 905 are formed with a thickness of 25 to 80 nm (preferably 30 to 60 nm). The material of the crystalline semiconductor film is not particularly limited, but it is preferable to form the film using silicon, a silicon germanium ($Si_xGe_{1-x}$ (typically X=0.0001 to 0.02)) alloy, or the like. In this embodiment, after forming an amorphous silicon film with a thickness of 55 nm by plasma CVD, a nickel-containing solution is maintained on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, laser annealing process is performed to form the crystalline silicon film. Then, this crystalline silicon film is subjected to a patterning process using a photolithography method, to thereby form the semiconductor layers 902 to 905.

Further, after the formation of the semiconductor layers 902 to 905, doping of a minute amount of an impurity element (boron or phosphorus) may be conducted to control a threshold of the TFT.

Besides, in the case where the crystalline semiconductor film is manufactured by the laser crystallization method, a pulse oscillation type or continuous-emission type excimer laser, YAG laser, or $YVO_4$ laser may be used. In the case where those lasers are used, it is appropriate to use a method in which laser light radiated from a laser oscillator is converged into a linear shape by an optical system, and is irradiated onto the semiconductor film. Although the conditions of the crystallization should be properly selected by an operator, in the case where the excimer laser is used, a pulse oscillation frequency is set to 300 Hz, and a laser energy density is set to 100 to 400 $mJ/cm^2$ (typically 200 to 300 $mJ/cm^2$). Further, in the case where the YAG laser is used, it is appropriate that the second harmonic is used to set a pulse oscillation frequency to 30 to 300 kHz, and a laser energy density to 300 to 600 $mJ/cm^2$ (typically, 350 to 500 $mJ/cm^2$). Then, laser light converged into a linear shape with a width of 100 to 1000 μm, for example, 400 μm is irradiated to the entire surface of the substrate, and an overlapping ratio (overlap ratio) of the linear laser light at this time may be set to 50 to 90%.

A gate insulating film 906 is then formed for covering the semiconductor layers 902 to 905. The gate insulating film 906 is formed from an insulating film containing silicon by plasma CVD or sputtering into a film thickness of from 40 to 150 nm. In the embodiment, the gate insulating film 906 is formed from a silicon nitride oxide film into a thickness of 110 nm by plasma CVD (composition ratio Si=32%, O=59%, N=7%, and H=2%). Of course, the gate insulating film is not limited to the silicon nitride oxide film, an insulating film containing other silicon may be formed into a single layer of a lamination structure.

Beside, when the silicon oxide film is used, it can be formed by plasma CVD in which TEOS (tetraethyl orthosilicate) and $O_2$ are mixed, with a reaction pressure of 40 Pa, a substrate temperature of from 300 to 400° C., and discharged at a high frequency (13.56 MHz) power density of 0.5 to 0.8 $W/cm^2$. Good characteristics as the gate insulating film can be obtained in the silicon oxide film thus manufactured by subsequent thermal annealing at 400 to 500° C.

Thereafter, a heat-resistant conductive layer 907 for forming a gate electrode is formed on the gate insulating film 906 with a first shape so as to have a thickness of 200 to 400 nm (preferably 250 to 350 nm). The heat-resistant conductive layer 907 may be a single layer, or alternatively, have a layered-structure including a plurality of layers such as two or three layers, if necessary. The heat-resistive conductive layer in the present specification includes a film made of elements selected from the group consisting of Ta, Ti, and W, an alloy film including the aforementioned elements as constituent components, or an alloy film in which the aforementioned elements are combined. These heat-resistive conductive layers can be formed with a sputtering method or a CVD method, and it is preferable to reduce the concentration of impurities contained therein in order to obtain a low resistance. Especially, the oxygen concentration is preferably set to be at 30 ppm or lower. In this embodiment, the W film may be formed to have a thickness of 300 nm. The W film may be formed with a sputtering method employing a W target, or with a thermal CVD method employing hexafulouride tungsten ($WF_6$). In either case, the resistance of the film is required to be lowered in order to be used as a gate electrode, so that the resistivity of the resultant W film is preferably set to be at 20 μΩcm or lower. The W film can have a lower resistivity with a larger grain size. However, when a larger amount of impurity elements such as oxygen is contained in the W film, crystallization is adversely affected to cause high resistance. Thus, in the case where a sputtering method is employed to form a W film, a W target with the purity of 99.99% or 99.9999% are employed, and sufficient attention is paid so as to prevent impurities from being mixed into the W film from the ambient atmosphere during the deposition, thereby resulting in a resistivity of 9 to 20 μΩcm.

On the other hand, in the case where a Ta film is used as the heat-resistive conductive layer 907, the film can be similarly formed with a sputtering method. For the Ta film, an Ar gas is used as a sputtering gas. In addition, when an appropriate amount of Xe or Kr are added into the gas during the sputtering process, an internal stress of the resultant film can be relaxed so that the film can be prevented from being peeled off. The resistivity of the α-phase Ta film is about 20 μΩcm, and thus can he used as a gate electrode. However, the β-phase Ta film has the resistivity of about 180 μΩcm, which is not suitable for forming a gate electrode. Since the TaN film has a crystal structure close to that of the α-phase Ta film, the α-phase Ta film can be easily obtained by forming the underlying TaN film prior to the deposition of the Ta film. In addition, although not illustrated, it is effective to form a silicon film having a thickness of about 2 to 20 nm and doped with phosphorus (P) below the heat-resistive conductive layer 907. Thus, close adhesion to the overlying conductive film as well as prevention of oxidation can be realized, and furthermore, alkaline metal elements contained in the heat-resistive conductive layer 907 at a minute amount can be prevented from being diffused into the gate insulating film 906 having the first shape. In either case, it is preferable to set the resistivity of the heat-resistive conductive layer 907 in the range from 10 to 50 μΩcm.

Then, other masks 908 made of a resist are formed with a photolithography technique. A first etching process is then performed. In this embodiment, an ICP etching apparatus is employed with $Cl_2$ and $CF_4$ as etching gases, and the etching is performed by forming plasma with an applied RF (13.56 MHz) power of 3.2 $mW/cm^2$ under a pressure of 1 Pa. An RF (13.56 MHz) power of 224 $mW/cm^2$ is also applied to the substrate (to a sample stage), so that substantially a negative self-biasing voltage can be applied. An etching speed of the W film under the above conditions is about 100 nm/min. In the first etching process, a time period required for the W film to be just etched away is calculated based on the above-mentioned etching speed, and the resultant time period is increased by 20% to be set as the actual etching time period.

Conductive layers 909 to 912 having a first tapered shape are formed through the first etching process. The tapered angle of 15 to 30 degrees can he obtained. In order to perform the etching process without remaining any etching residue, overetching is performed in which an etching time is increased by 10 to 20%. A selection ratio of the silicon nitride oxide film (the gate insulating film 906) with respect to the W film is about 2 to 4 (typically 3), and therefore, the exposed surface of the silicon nitride oxide film can be etched away by about 20 to 50 nm through the overetching. (See FIG. 11B.)

Thereafter, a first doping process is performed so that impurity elements with one conductivity type are added into the semiconductor layers. In this embodiment, the impurity elements providing the n-type conductivity are added. The mask 908 used for forming the first-shaped conductive layers are remained, and the conductive layers 909 to 912 having the first tapered shapes are used as masks so that the impurity elements for providing the n-type conductivity are added with the ion doping method in a self-aligning manner. In order that the impurity elements for providing the n-type conductivity are added so as to pass through the tapered portion and the gate insulating film 906 at the end portion of the gate electrode and reach the underlying semiconductor layer, the dosage is set in the range from $1 \times 10^{-}$ to $5 \times 10^{14}$ $atoms/cm^2$ and the accelerating voltage is set in the range from 80 to 160 keV. As the impurity elements for providing the n-type conductivity, elements in Group 15 in the periodic table, typically phosphorus (P) or arsenic (As), can be used. In this embodiment, phosphorus (P) is used. Through the above-described ion doping method, the impurity elements for providing the n-type conductivity are added to first impurity regions 914 to 917 in the concentration range from $1 \times 10^{20}$ to $1 \times 10^{21}$ $atoms/cm^3$. (See FIG. 11C.)

In this processes, the impurity elements are entered below the first conductive layers 909 to 912, and the first impurity elements regions 914 to 917 may overlap with the first conductive layers 909 to 912 according to the doping condition.

Then, as shown in FIG. 11D, a second etching process is performed. This etching process is similarly performed with the ICP etching apparatus by employing a mixture gas of $CF_4$ and $Cl_2$ as an etching gas under the conditions of an applied RF power of 3.2 $W/cm^2$ (13.56 MHz) and a bias power of 45 $mW/cm^2$ (13.56 MHz) under a pressure of 1.0 Pa. Thus, conductive layers 918 to 921 are formed to have a second shape obtainable under these conditions. Tapered portions are formed at respective end portions thereof, in which a thickness is gradually increased inwardly from the respective end portions. As compared with the first etching process, an isotropic etching component is increased due to a reduction in the bias power to be applied to the substrate side, so that the tapered portions are formed to have an angle of 30 to 60 degrees. The mask 908 are shaved the periphery potion by an etching, and then it will be as the mask 922. In addition, the surfaces of the gate insulating films 906 are etched away by about 40 nm in the process of FIG. 11D.

Thereafter, the impurity elements for providing the n-type conductivity are doped with a reduced dosage at a higher accelerating voltage, as compared to the first doping process. For example, the accelerating voltage is set in the range from 70 to 120 keV and the dosage is set at $1 \times 10^{13}$ $atoms/cm^2$. The concentrated first impurity element regions 924 to 927 and the second impurity element regions 928 to 931 which comes in contact with the above-mentioned first impurity element regions 924 to 927 are formed. In this processes, impurity elements are entered below the second shaped conductive layers 918 to 921, and the second impurity regions 928 to 931 may overlap with the second impurity layers 918 to 921 according to the doping condition. The second shape are set to be in the range from $1 \times 10^{16}$ to $1 \times 10^{18}$ $atoms/cm^3$. (See FIG. 12A.)

Then, as shown in FIG. 12B, impurity regions 933 (933a and 933b) and 934 (934a and 934b) with the opposite conductivity are formed in the semiconductor layers 902 and 905 that constitute p-channel TFTs. The impurity elements for providing the p-type conductivity are doped with the second shaped conductive layers 918 and 921 as masks to form the impurity regions in a self-aligning manner. In this case, the island-shaped semiconductor layers 903 and 904 that constitute the n-channel TFTs are entirely covered with resist masks 932. The impurity regions 933 and 934 in this stage are formed with the ion doping method employing diborane ($B_2H_6$). The concentrations of the impurity elements for providing the p-type conductivity in the impurity regions 933 and 934 are set in the range from $2 \times 10^{20}$ to $2 \times 10^{21}$ $atoms/cm^3$.

However, these impurity regions 933 and 934 when viewed in more detail can be divided into two regions containing the impurity elements for providing the n-type conductivity. More specifically, third impurity regions 933a and 934a contain the impurity elements for providing the n-type conductivity in the range from $1 \times 10^{20}$ to $1 \times 10^{21}$ $atoms/cm^3$, fourth impurity regions 933b and 934b contain the impurity elements for providing the n-type conductivity in the range from $1 \times 10^{17}$ to $1 \times 10^{20}$ $atoms/cm^3$. However, when the concentrations of the impurity elements for providing the p-type conductivity are set to be at $1 \times 10^{19}$ $atoms/cm^3$ or more in the fourth impurity regions 933b and 934b, and the concentrations of the impurity elements for providing the p-type conductivity are set to become 1.5 to 3 times larger in the third impurity regions 934a and 934a, no adverse problems occur for allowing the third impurity regions to function as source and drain regions of the p-channel TFTs.

Thereafter, as shown in FIG. 12C, a first interlayer insulating film 937 is formed over the second shaped conductive layers 918 to 921 and the gate insulating film 906. The first interlayer insulating film 937 may be formed of a silicon oxide film, a silicon nitride film, a silicon nitride oxide film, or a layered film in which these films are combined. In either case, the first interlayer insulating film 937 is formed of an inorganic insulating material. The film thickness of the first interlayer insulating film 937 is set to be in the range from 100 to 200 nm. When a silicon oxide film is to be employed, the film is formed with the plasma CVD method in which TEOS and $O_2$ are mixed to each other, and the discharge is generated under the conditions of a reaction pressure of 40 Pa, a substrate temperature in the range of 300 to 400° C., and a high frequency (13.56 MHz) power density of 0.5 to 0.8 W/cm$^2$. When a silicon nitride oxide film is to be employed, as the first interlayer insulating film 937 the film is formed of a silicon nitride oxide film formed with the plasma CVD method from $SiH_4$, $N_2O$, and $NH_3$, or a silicon nitride oxide film formed with the plasma CVD method from $SiH_4$ and $N_2O$. The film formation conditions in these cases are set as follows: a reaction pressure in the range from 20 to 200 Pa, a substrate temperature in the range of 300 to 400° C., and a high frequency (60 MHz) power density of 0.1 to 1.0 W/cm$^2$. Alternatively, a hydrogenated silicon nitride oxide film formed from $SiH_4$, $N_2O$, and $H_2$ may also be used as the first interlayer insulating film 937. A silicon nitride film can also be formed with a plasma CVD method from $SiH_4$ and $NH_3$.

Then, a process for activating the impurity elements providing the p-type and n-type conductivities added at the respective concentrations is performed. This process is realized as a thermal annealing method which employs a furnace anneal oven. Alternatively, a laser annealing method, or a rapid thermal annealing method (RTA method) may be applied for that purpose. The thermal annealing is performed within a nitrogen atmosphere having the oxygen concentration of 1 ppm or lower, preferably 0.1 ppm or lower, at 400 to 700° C., typically 500 to 600° C. In this embodiment, the thermal annealing is performed at 550° C. for 4 hours. In the case where a plastic substrate having a low heating endurance temperature is employed for the substrate 501, a laser annealing method is preferably employed.

After the activation process, the surrounding atmospheric gases are switched to a hydrogen atmosphere containing hydrogens at the concentration of 3 to 100%. A heat process is performed in this atmosphere at 300 to 450° C. for 1 to 12 hours so that the semiconductor layers are hydrogenated. In this process, dangling bonds existing in the semiconductor layers at the concentration of $10^{16}$ to $10^{18}$ /cm$^3$ are terminated with thermally excited hydrogens. As another means for the hydrogenation, plasma hydrogenation (in which hydrogens excited by means of plasma are employed) may be performed. In either case, the defect densities in the island-shaped semiconductor layers 902 to 905 are preferably set to be at $10^{16}$ /cm$^3$ or lower. For that purpose, hydrogens in the semiconductor layers are added at the concentration of about 0.01 to 0.1 atomic %.

Then, a second interlayer insulating film 939 made of an organic insulating material is formed from 1.0 to 2.0 µm. As the organic insulating material, polyimide, acrylic, polyamide, polyimideamide, BCB (benzocyclobutene), or the like may be used. Here, polyimide of the type that is thermally polymerized after being applied to the substrate is used, and the film is formed by carrying out baking at 300° C. In the case where an acrylic resin is to be used, a two-liquid type material is used. A main component and a curing agent are mixed and the resultant mixture is applied onto the entire substrate by a spinner, and thereafter, a preliminary heating at 80° C. for 60 seconds is performed with a hot plate and the baking is further performed in a clean oven at 250° C. for 60 minutes.

By thus forming the second interlayer insulating film 939 of an organic insulating material, the surface thereof can be easily planarized. In addition, since the organic resign material has in general a low dielectric constant, a parasitic capacitance can he reduced. However, the organic resin material tends to absorb water, and therefore, is not suitable for the use as a protective film. Accordingly, as in this embodiment, it is preferable to combine the organic insulating film with a silicon oxide film, a silicon nitride oxide film or a silicon nitride film formed as the first interlayer insulating film 937.

Thereafter, a resist mask having a predetermined pattern is formed to form contact holes that reach the respective impurity regions formed in the semiconductor layers so as to function as a source or drain region. These contact holes are formed with a dry etching method. In this case, a mixture gas of $CF_4$, $O_2$, and He is used as an etching gas to first etch away the second interlayer insulating film 939 made of the organic insulating material. The first interlayer insulating film 937 is then etched away with a mixture gas of $CF_4$ and $O_2$ as an etching gas. Furthermore, the etching gas is switched to $CHF_3$ so as to enhance a selection ratio with respect to the semiconductor layers, and the third shaped gate insulating films 906 are etched away, thereby resulting in the contact holes being formed.

A conductive metal film is formed by sputtering or vacuum evaporation and is patterned using a mask. The film is then etched to form source wiring lines 940 to 943 and drain wiring lines 944 to 946. Though not shown in the drawings, the wiring lines in this embodiment are a laminate of a Ti film with a thickness of 50 nm and an alloy film (alloy film of Al and Ti) with a thickness of 500 nm.

A transparent conductive film is formed thereon to have a thickness of 80 to 120 nm and is patterned to form a pixel electrode 947 (FIG. 13A). This embodiment uses as the transparent electrode an indium tin oxide (ITO) film or a transparent conductive film obtained by mixing 2 to 20% of zinc oxide (ZnO) with indium oxide.

The pixel electrode 947 is electrically connected to a drain region of a driving TFT 963 by forming the pixel electrode such that it contacts and overlaps the drain wiring line 946.

Next, a third interlayer insulating film 949 having an aperture at a position that coincides with the pixel electrode 947 is formed as shown in FIG. 13B. The third interlayer insulating film 949 is capable of insulating, and functions as a bank to separate organic compound layers of adjacent pixels from each other. This embodiment uses a resist for the third interlayer insulating film 949.

In this embodiment, the third interlayer insulating film 949 is about 1 µm in thickness and the aperture is shaped to have a so-called reverse tapered shape in which the width is increased toward the pixel electrode 947. This is obtained by covering the resist film with a mask except the portion where the aperture is to be formed, exposing the film through irradiation of UV light, and then removing the exposed portion using a developer.

The third interlayer insulating film 949 reversely tapered as in this embodiment separates organic compound layers of adjacent pixels from each other when the organic compound layers are formed in a later step. Therefore cracking or peeling of the organic compound layers can be prevented even if the organic compound layers and the third interlayer insulating film 949 have different thermal expansion coefficient.

Although a resist film is used in this embodiment for the third interlayer insulating film, polyimide, polyamide, acrylic, BCB (benzocycrobutene), or silicon oxide film may be used in some cases. The third interlayer insulating film 949 may be organic or inorganic as long as the material is capable of insulating.

An organic compound layer 950 is formed by evaporation. A cathode (MgAg electrode) 951 and a protective electrode 952 are also formed by evaporation. Desirably, heat treatment is performed on the pixel electrode 947 to remove moisture completely from the electrode before forming the organic compound layer 950 and the cathode 951. Though the cathode of the light emitting element is a MgAg electrode in this embodiment, other known materials may be used instead.

The organic compound layer 950 can be formed from a known material. In this embodiment, the organic compound layer has a two-layer structure consisting of a hole transporting layer and a light emitting layer. The organic compound layer may additionally have a hole injection layer, an electron injection layer, or an electron transporting layer. Various combinations of these layers have been reported and any of them can be used.

In this embodiment, the hole transporting layer is polyphenylene vinylene deposited by evaporation. The light emitting layer is obtained by evaporation of polyvinyl carbazole with molecular dispersion of 30 to 40% of PBD that is a 1, 3, 4-oxadiazole derivative and by doping the resultant film with about 1% of coumarine 6 as green color luminescent center.

The protective electrode 952 alone can protect the organic compound layer 950 from moisture and oxygen but adding a protective film 953 is more desirable. The protective film 953 in this embodiment is a silicon nitride film with a thickness of 300 nm. The protective electrode and the protective film may be formed in succession without exposing the substrate to the air.

The protective electrode 952 also prevents degradation of the cathode 951. Typically, a metal film containing aluminum as its main ingredient is used for the protective electrode. Other materials may of course be used. The organic compound layer 950 and the cathode 951 are very weak against moisture. Therefore it is desirable to form them and the protective electrode 952 in succession without exposing the substrate to the air to protect them from the outside air.

The organic compound layer 950 is 10 to 400 nm in thickness (typically 60 to 150 nm). The cathode 951 is 80 to 200 nm in thickness (typically 100 to 150 nm).

Thus completed is a light emitting device structured as shown in FIG. 13B. A portion 954 where the pixel electrode 947, the organic compound layer 950, and the cathode 951 overlap corresponds to the light emitting element.

A p-channel TFT 960 and an n-channel TFT 961 are TFTs of the driving circuit 970 and constitute a CMOS. A switching TFT 962 and a driving TFT 963 are TFTs of the pixel portion 971. The TFTs of the driving circuit 970 and the TFTs of the pixel portion 971 can be formed on the same substrate.

In the case of a light emitting device using a light emitting element, its driving circuit can be operated by a power supply having a voltage of 5 to 6V, 10 V, at most. Therefore, degradation of TFTs due to hot electron is not a serious problem. Also, smaller gate capacitance is preferred for the TFTs since the driving circuit needs to operate at high speed. Accordingly, in a driving circuit of a light emitting device using a light emitting element as in this embodiment, the second impurity region 929 and the fourth impurity region 933b of the semiconductor layers of the TFTs preferably do not overlap the gate electrode 918 and the gate electrode 919, respectively.

The method of manufacturing the light emitting device of the present invention is not limited to the one described in this embodiment. The light emitting device of the present invention may be manufactured by a known method.

This embodiment may be combined freely with Embodiments 1 through 7.

Embodiment 9

This embodiment describes a different method of manufacturing a light emitting device of the present invention from the method in Embodiment 8.

Steps up through the step of forming the second interlayer insulating film 939 are the same as in Embodiment 8. After the second interlayer insulating film 939 is formed, a passivation film 939 is formed such that it is in contact with the second interlayer insulating film 939 as shown in FIG. 14A.

The passivation film 939 is effective in preventing moisture contained in the second interlayer insulating film 939 from seeping into the organic compound layer 950 through the pixel electrode 947 and a third interlayer insulating film 982. Providing the passivation film 939 is effective especially when the second interlayer insulating film 939 has an organic resin material since organic resin materials contain a lot of moisture.

In this embodiment, a silicon nitride film is used as the passivation film 939.

Thereafter, a resist mask having a given pattern is former and contact holes are formed to reach impurity regions that serve as source regions or drain regions in the respective semiconductor layers. The contact holes are formed by dry etching. In this case, a mixture gas of $CF_4$, $O_2$, and He is used as etching gas to etch the second interlayer insulating film 939 formed of an organic resin material first. Then the etching gas is changed to $CF_4$ and $O_2$ to etch the first interlayer insulating film 937. The etching gas is further switched to $CHF_3$ in order to raise the selective ratio with respect to the semiconductor layers, and the third shape gate insulating film 906 is etched to form the contact holes.

Further, a conductive metal film is formed by sputtering or vacuum evaporation and is patterned using a mask. The film is then etched to form source wiring lines 940 to 943 and drain wiring lines 944 to 946. Though not shown in the drawings, the wiring lines in this embodiment are a laminate of a Ti film with a thickness of 50 nm and an alloy film (alloy film of Al and Ti) with a thickness of 500 nm.

A transparent conductive film is formed thereon to have a thickness of 80 to 120 nm and is patterned to form the pixel electrode 947 (FIG. 14A). This embodiment uses as the transparent electrode an indium tin oxide (ITO) film or a transparent conductive film obtained by mixing 2 to 20% of zinc oxide (ZnO) with indium oxide.

The pixel electrode 947 is electrically connected to a drain region of a driving TFT by forming the pixel electrode such that it contacts and overlaps the drain wiring line 946.

Next, the third interlayer insulating film 982 having an aperture at a position that coincides with the pixel electrode 947 is formed as shown in FIG. 14B. This embodiment uses dry etching in forming the aperture, thereby shaping it into tapered side walls. Unlike the case shown in Embodiment 8, organic compound layers to be formed on the third interlayer insulating film 982 are not separated from each other. Therefore, side walls of the aperture have to be tapered gently. Otherwise degradation of organic compound layers caused by the level difference will be a serious problem.

Although a silicon oxide film is used in this embodiment as the third interlayer insulating film 982, a film of an organic resin such as polyimide, polyamide, acrylic, or BCB (benzocycrobutene) may be used in some cases.

Preferably, plasma treatment using argon is performed on the surface of the third interlayer insulating film 982 before forming the organic compound layer 950 on the third interlayer insulating film 982, thereby increasing the density of the surface of the third interlayer insulating film 982. With the above structure, moisture from the third interlayer insulating film 982 is prevented from seeping into the organic compound layer 950.

The organic compound layer 950 is formed by evaporation. A cathode (MgAg electrode) 951 and a protective electrode 952 are also formed by evaporation. Desirably, heat treatment is performed on the pixel electrode 947 to remove moisture completely from the electrode before forming the organic compound layer 950 and the cathode 951. Though the cathode of the light emitting element is a MgAg electrode in this embodiment, other known materials may be used instead.

The organic compound layer 950 can be formed from a known material. In this embodiment, the organic compound layer has a two-layer structure consisting of a hole transporting layer and a light emitting layer. The organic compound layer may additionally have a hole injection layer, an electron injection layer, or an electron transporting layer. Various combinations of these layers have been reported and any of them can be used.

In this embodiment, the hole transporting layer is polyphenylene vinylene deposited by evaporation. The light emitting layer is obtained by evaporation of polyvinyl carbazole with molecular dispersion of 30 to 40% of PBD that is a 1, 3, 4-oxadiazole derivative and by doping the resultant film with about 1% of coumarine 6 as green color luminescence center.

The protective electrode 952 alone can protect the organic compound layer 950 from moisture and oxygen but adding a protective film 953 is more desirable. The protective film 953 in this embodiment is a silicon nitride film with a thickness of 300 nm. The protective electrode and the protective film may be formed in succession without exposing the substrate to the air.

The protective electrode 952 also prevents degradation of the cathode 951. Typically, a metal film containing aluminum as its main ingredient is used for the protective electrode. Other materials may of course be used. The organic compound layer 950 and the cathode 951 are very weak against moisture. Therefore, it is desirable to form them and the protective electrode 952 in succession without exposing the substrate to the air to protect them from the outside air.

The organic compound layer 950 is 10 to 400 nm in thickness (typically 60 to 150 nm). The cathode 951 is 80 to 200 nm in thickness (typically 100 to 150 nm).

Thus completed is a light emitting device structured as shown in FIG. 14B. A portion 954 where the pixel electrode 947, the organic compound layer 950, and the cathode 951 overlap corresponds to the light emitting element.

A p-channel TFT 960 and an n-channel TFT 961 are TFTs of the driving circuit 970 and constitute a CMOS. A switching TFT 962 and a driving TFT 963 are TFTs of the pixel portion 971. The TFTs of the driving circuit 970 and the TFTs of the pixel portion 971 can be formed on the same substrate.

The method of manufacturing the light emitting device of the present invention is not limited to the one described in this embodiment. The TFTs of the light emitting device of the present invention may be manufactured by a known method.

This embodiment may be combined freely with Embodiments 1 through 8.

Embodiment 10

In this embodiment, an external light-emitting quantum efficiency can be remarkably improved by using an organic compound material by which phosphorescence from a triplet exciton can be employed for emitting a light. As a result, the power consumption of the light-emitting element can be reduced, the lifetime of the light-emitting element can be elongated and the weight of the light-emitting element can be lightened.

The following is a report where the external light-emitting quantum efficiency is improved by using the triplet exciton (T. Tsutsui, C. Adachi, S. Saito, Photochemical processes in Organized Molecular System, ed. K. Honda, (Elsevier Sci. Pub., Tokyo, 1991) p. 437).

The molecular formula of an organic compound material (coumarin pigment) reported by the above article is represented as follows.

(Chemical formula 1)

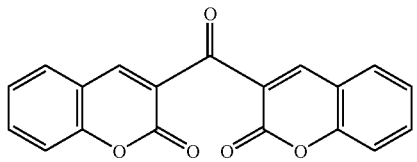

(M. A. Baldo, D. F. O'Brien, Y. You, A. Shoustikov, S. Sibley, M. E. Thompson, S. R. Forrest, Nature 395 (1998) p. 151)

The molecular formula of an organic compound material (Pt complex) reported by the above article is represented as follows.

(Chemical formula 2)

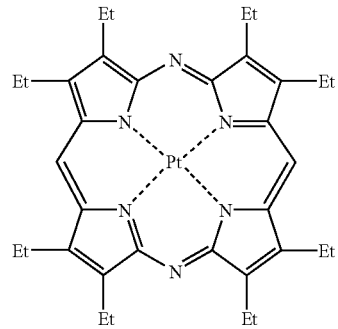

(M. A. Baldo, S. Lamansky, P. E. Burrows, M. E. Thompson, S. R. Forrest, Appl. Phys. Lett., 75 (1999) p.4.)

(T. Tsutsui, M. J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic compound material (Ir complex) reported by the above article is represented as follows.

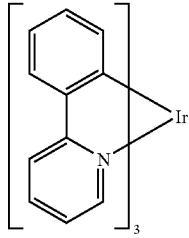

(Chemical formula 3)

As described above, if phosphorescence from a triplet exciton can be put to practical use, it can realize the external light-emitting quantum efficiency three to four times as high as that in the case of using fluorescence from a singlet exciton in principle.

Further, the structure of this embodiment can be implemented by freely combining with any structure of Embodiments 1 to 9.

Embodiment 11

This embodiment describes an example of manufacturing a light emitting device of the present invention with reference to FIGS. 15A to 15C.

FIG. 15A is a top view of a light emitting device obtained by sealing with a sealing member a substrate with a light emitting element and TFTs formed on a surface (TFT substrate). FIG. 15B is a sectional view taken along the Line A–A' of FIG. 15A. FIG. 15C is a sectional view taken along the line B–B' of FIG. 15A.

A pixel portion 4002, a source signal line driving circuit 4003, and writing and erasing gate signal line driving circuits 4004a and 4004b are formed on a substrate 4001. A seal member 4009 is provided so as to surround the pixel portion and the driving circuits. A sealing member 4008 is provided over the pixel portion 4002, the source signal line driving circuit 4003, and the writing and erasing gate signal line driving circuits 4004a and 4004b. Accordingly, the pixel portion 4002, the source signal line driving circuit 4003, and the writing and erasing gate signal line driving circuits 4004a and 4004b are sealed by the substrate 4001, the seal member 4009 and the sealing member 4008 using a filler 4210.

The pixel portion 4002, the source signal line driving circuit 4003, and the writing and erasing gate signal line driving circuits 4004a and 4004b that are formed over the substrate 4001 have a plurality of TFTs. FIG. 15B shows as exemplary TFTs a driving circuit TFT (an n-channel TFT and a p-channel TFT are shown here) 4201 included in the source signal line driving circuit 4003 and a driving TFT (a TFT that controls current flowing into a light emitting element) 4202 included in the pixel portion 4002. The TFTs 4201 and 4202 are formed on a base film 4010.

In this embodiment, the driving circuit TFT 4201 is a p-channel TFT and an n-channel TFT that are manufactured by a known method and the driving TFT 4202 is a p-channel TFT manufactured by a known method. The pixel portion 4002 is provided with a capacitor storage (not shown) that is connected to a gate of the driving TFT 4202.

On the driving circuit TFT 4201 and the driving TFT 4202, an interlayer insulating film (planarization film) 4301 is formed. A pixel electrode (anode) 4203 is formed thereon to be electrically connected to a drain region of the driving TFT 4202. A transparent conductive film having a large work function is used for the pixel electrode 4203. The transparent conductive film may be formed from a compound of indium oxide and tin oxide or a compound of indium oxide and zinc oxide, or from zinc oxide, tin oxide, or indium oxide alone. The transparent conductive film may be added with gallium.

On the pixel electrode 4203, an insulating film 4302 is formed. An aperture is formed above the pixel electrode 4203 in the insulating film 4302. In the aperture, an organic compound layer 4204 is formed above the pixel electrode 4203. The organic compound layer 4204 is formed from a known organic or inorganic compound material that provides luminescence generated upon application of electric field. Organic compound materials are divided into low-molecular weight (monomer) materials and high molecular weight (polymer) materials and both types can be used.

A known evaporation technique or coating technique is used to form the organic compound layer 4204. The organic compound layer may be a single layer of light emitting layer, or may he a laminate obtained by combining a light emitting layer with layers selected from a hole injection layer, a hole transporting layer, an electron transporting layer, and an electron injection layer.

A cathode 4205 is formed on the organic compound layer 4204 from a light-shielding conductive film (typically, a conductive film containing aluminum, copper or silver as its main ingredient, or a laminate of this conductive film and other conductive films). Desirably, moisture and oxygen present at the interface between the cathode 4205 and the organic compound layer 4204 are removed as much as possible. To achieve this, some devising is needed such as forming the organic compound layer 4204 in a nitrogen or noble gas atmosphere and then forming the cathode 4205 without allowing oxygen and moisture to contact with the films. This embodiment achieves such film formation by using a multi-chamber type (cluster tool type) film formation apparatus. A given voltage is applied to the cathode 4205.

Thus completed is a light emitting element 4303 composed of the pixel electrode (anode) 4203, the organic compound layer 4204, and the cathode 4205. A protective film 4209 is formed on the insulating film 4302 so as to cover the light emitting element 4303. The protective film 4209 is effective in preventing oxygen and moisture from entering the light emitting element 4303.

Denoted by 4005a is a lead-out wiring line that is connected to a power supply line and electrically connected to a source region of the driving TFT 4202. The lead-out wiring line 4005a runs between the seal member 4009 and the substrate 4001 and is electrically connected to an FPC wiring line 4401 of an FPC 4006 through an anisotropic conductive film 4300.

The sealing member 4008 may be glass, metals (typically stainless steel), ceramics, or plastics (including plastic films). Plastics usable as the sealing member include FRP (fiberglass-reinforced plastics) plates, PVF (polyvinyl fluoride) films, Mylar films, polyester films, and acrylic resin films. A sheet of aluminum foil sandwiched between PVF films or Mylar films may also be used.

However, the sealing member has to be transparent when light is emitted from the light emitting element toward the sealing member side. In this case, a transparent material such as a glass plate, a plastic plate, a polyester film, or an acrylic film is used.

The filler 4210 may be inert gas such as nitrogen or argon. A UV curable resin or a thermally curable resin may be used as well and examples of the usable resin include PVC (polyvinyl chloride), acrylic, polyimide, an epoxy resin, a silicone resin, PVB (polyvinyl butylal), and EVA (ethylene vinyl acetate). The filler used in this embodiment is nitrogen.

In order to expose the filler 4210 to a hygroscopic substance (preferably barium oxide) or a substance capable of adsorbing oxygen, a concave portion 4007 is provided on a surface of the sealing member 4008 which faces the substrate 4001 to place a hygroscopic or oxygen-adsorbing substance 4207. The hygroscopic or oxygen-adsorbing substance 4207 is held to the concave portion 4007 by a concave portion cover member 4208 to prevent the hygroscopic or oxygen-adsorbing substance 4207 from scattering. The concave portion cover member 4208 is a dense mesh so that air and moisture are allowed to pass but not the hygroscopic or oxygen-adsorbing substance 4207. By providing the hygroscopic or oxygen-adsorbing substance 4207, degradation of the light emitting element 4303 can be controlled.

As shown in FIG. 15C, a conductive film 4203a is formed such that it is in contact with the top face of the lead-out wiring line 4005a at the same time the pixel electrode 4203 is formed.

The anisotropic conductive film 4300 has a conductive filler 4300a. When the substrate 4001 and the FPC 4006 are thermally press-fitted, the conductive filler 4300a electrically connects the conductive film 4203a on the substrate 4001 with the FPC wiring line 4401 on the FPC 4006.

This embodiment can be combined freely with Embodiments 1 through 10.

Embodiment 12

The light-emitting device is of the self-emission type, and thus exhibits more excellent recognizability of the displayed image in a light place as compared to the liquid crystal display device. Furthermore, the self-emission device has a wider viewing angle. Accordingly, the light-emitting device can be applied to a display portion in various electronic devices.

Such electronic devices include a video camera, a digital camera, a goggles-type display (head mount display), a navigation system, a sound reproduction device (a car audio equipment and an audio set), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIGS. 16A to 16H respectively show various specific examples of such electronic devices.

Figure 16A:
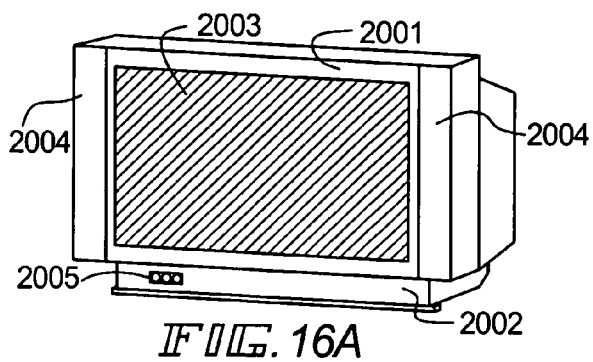
FIGS. 16A to 16H are diagrams of electronic equipment using a light emitting device of Embodiment 12.

FIG. 16A illustrates an electro-luminescence display device which includes a frame 2001, a support table 2002, a display portion 2003, a speaker portion 2004, a video input terminal 2005 or the like. The present invention is applicable to the display portion 2003. The light-emitting device is of the self-emission type and therefore requires no back light. Thus, the display portion thereof can have a thickness thinner than that of the liquid crystal display device. The electro-luminescence display device is including all of the display device for displaying information, such as a personal computer, a receiver of TV broadcasting and an advertising display.

Figure 16B:
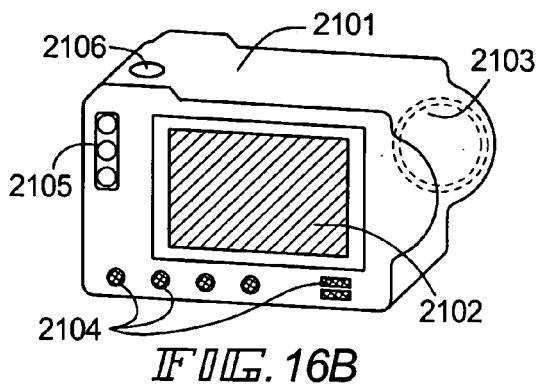

FIG. 16B illustrated a digital still camera which includes a main body 2101, a display portion 2102, an image receiving portion 2103, an operation key 2104, an external connection port 2105, a shutter 2106, or the like. The light-emitting device in accordance with the present invention can be used as the display portion 2102.

Figure 16C:
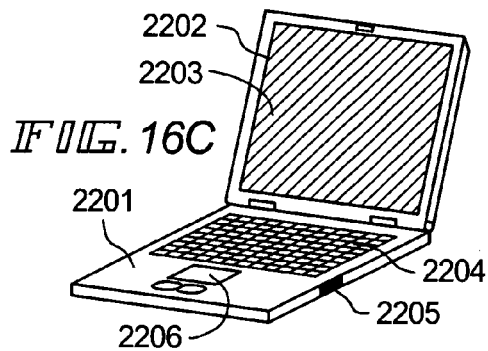

FIG. 16C illustrates a laptop (note-size) computer which includes a main body 2201, a casing 2202, a display portion 2203, a keyboard 2204, an external connection port 2205, a pointing mouse 2206, or the like. The light-emitting device in accordance with the present invention can be used as the display portion 2203.

Figure 16D:
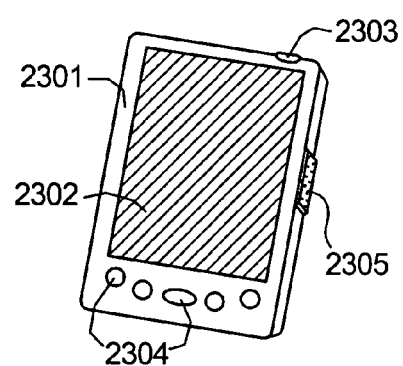

FIG. 16D illustrated a mobile computer which includes a main body 2301, a display portion 2302, a switch 2303, an operation key 2304, an infrared port 2305, or the like. The light-emitting device in accordance with the present invention can be used as the display portion 2302.

Figure 16E:
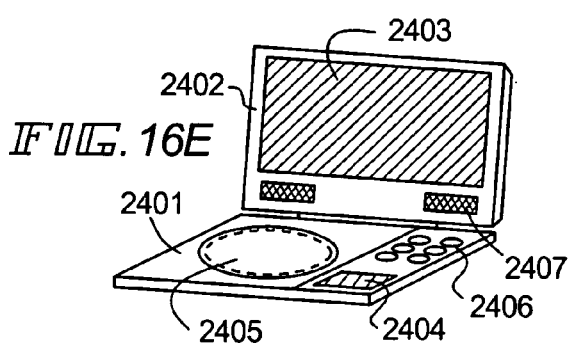

FIG. 16E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light-emitting device in accordance with the present invention can be used as these display portions A and B, 2403 and 2404. The image reproduction apparatus including a recording medium further includes a game machine or the like.

Figure 16F:
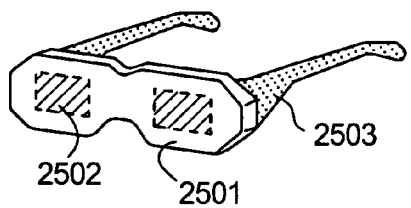

FIG. 16F illustrates a goggle type display (head mounted display) which includes a main body 2501, a display portion 2502, an arm portion 2503. The light-emitting device in accordance with the present invention can be used as the display portion 2502.

Figure 16G:
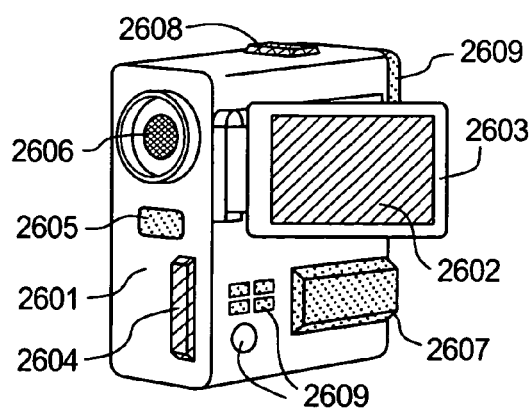

FIG. 16G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The light-emitting device in accordance with the present invention can be used as the display portion 2602.

Figure 16H:
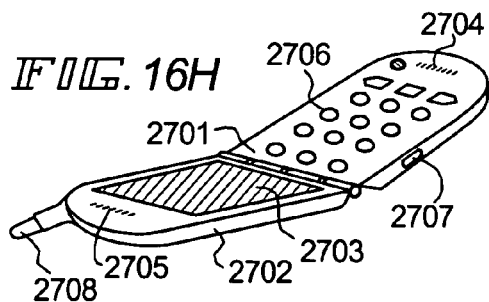

FIG. 16H illustrates a mobile phone (cellular phone) which includes a main body 2701, a casing 2702, a display portion 2703, a sound input portion 2704, a sound output portion 2705, an operation key 2706, an external connecting port 2707, an antenna 2708, or the like. The light-emitting device in accordance with the present invention can be used as the display portion 2703. Note that the display portion 2703 can reduce power consumption of the portable telephone by displaying white-colored characters on a black-colored background.

When the brighter luminance of light emitted from the organic compound layer becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic compound material can exhibit high response speed.

A portion of the light-emitting device that is emitting light consumes power, so it is desirable to display information in such a manner that the light-emitting portion therein becomes as small as possible. Accordingly, when the self-emission device is applied to a display portion which mainly displays character information, e.g., a display portion of a portable information terminal, and more particular, a portable telephone or a sound reproduction device, it is desirable to drive the light-emitting device so that the character information is formed by a light-emitting portion while a non-emission portion corresponds to the background.

As set forth above, the present invention can be applied variously to a wide range of electronic devices in all fields. The electronic device in the present embodiment can be obtained by utilizing a light-emitting device having the configuration in which the structures in Embodiments 1 through 11 are freely combined.

With the above structure, the present invention can prevent lengths of sub-frame periods from being shortened when the number of sub-frame periods in one frame period is increased. Accordingly, the invention can prevent a period for inputting digital video signals to pixels (a writing period) from being shortened and can increase the number of sub-frame periods while avoiding too high drive frequency of a source signal line driving circuit.

Thus a high gradation image can be displayed while avoiding lowering of frame frequency and too high drive frequency of the source signal line driving circuit.

Unlike a general area division driving method, sub-pixels in the present invention have almost the same pixel pitch. In a general area division driving method, design is made by setting the design rule for the smallest sub-pixel and it is therefore difficult to raise the definition. On the other hand, although a light emitting device of the present invention can raise the definition, the pixel pitch of the sub-pixels is almost the same when the gradation number is increased.

In a light emitting device of the present invention, a sub-frame period may be divided and other sub-frame periods or a period in which no image is displayed (non-display period) may be interspersed between the divided sub-frame periods, not successively starting the divided sub-frame periods. In a non-display period, light emitting elements in all of the pixels in the pixel portion do not emit light.

The animation pseudocontour can be avoided by the above structure.

Furthermore, in the light emitting device of the present invention, the length of one sub-frame period is not shortened even when a sub-frame period is divided to avoid the animation pseudocontour. The drive frequency of the source signal line driving circuit is thus prevented from increasing.

What is claimed is:

1. A light emitting device comprising:
   a plurality of pixels;
   each of the plurality of pixels having a plurality of sub-pixels; and
   each of the plurality of sub-pixels having a light emitting element, a thin film transistor, an erasing gate signal line and a power supply line,
   wherein each of the plurality of sub-pixels having a same area of effective light emission;
   wherein the light emitting element does not emit the light when the thin film transistor is on;
   wherein a gate electrode of the thin film transistor is electrically connected to the erasing gate signal line; and
   wherein one of a source region and a drain region of the thin film transistor is electrically connected to the power supply line.

2. A light emitting device comprising:
   a plurality of pixels;
   each of the plurality of pixels having a plurality of sub-pixels; and
   each of the plurality of sub-pixels having a light emitting element, a first thin film transistor, a second thin film transistor, an erasing gate signal line and a power supply line,
   wherein a current flowing in the light emitting element is controlled by the first thin film transistor;
   wherein each of the plurality of sub-pixels having a same area of effective light emission;
   wherein the light emitting element does not emit the light when the second thin film transistor is on;
   wherein a gate electrode of the second thin film transistor is electrically connected to the erasing gate signal line; and
   wherein one of a source region and a drain region of the second thin film transistor is electrically connected to the power supply line.

3. A device according to claim 2,
   wherein the thin film transistor in each of the plurality of sub-pixels has a same polarity.

4. An electronic apparatus using the light emitting device of claim 1.

5. A method of operating a light emitting device,
   said light emitting device comprising:
   a plurality of pixels;
   each of the plurality of pixels having a plurality of sub-pixels; and
   each of the plurality of sub-pixels having a light emitting element, a thin film transistor, an erasing gate signal line and a power supply line,
   said method comprising the steps of:
   controlling a period of time in which the light emitting element emits a light in each of the plurality of sub-pixels by a digital video signal to thereby control a gradation of the respective pixels,
   wherein each of the plurality of sub-pixels having a same area of effective light emission;
   wherein the light emitting element does not emit the light when the thin film transistor is on;
   wherein a gate electrode of the second thin film transistor is electrically connected to the erasing gate signal line; and
   wherein one of a source region and a drain region of the second thin film transistor is electrically connected to the power supply line.

6. A method of operating a light emitting device,
   said light emitting device comprising:
   a plurality of pixels;
   each of the plurality of pixels having a plurality of sub-pixels;
   each of the plurality of sub-pixels having a light emitting element, a thin film transistor, an erasing gate signal line and a power supply line;
   each of the plurality of sub-pixels having a same area of effective light emission, said method comprising the steps of:
  having a plurality of sub-frame periods in one frame period in the plurality of sub-pixels; and
  selecting whether or not the light emitting element in each of the plurality of sub-pixels emits a light for each of the plurality of sub-frame periods by each of bits of digital video signals,
wherein the larger the sum of lengths of sub-frame periods in which the light emitting element in each of the plurality of sub-pixels emits a light becomes, the higher a gradation number of the respective pixels becomes;
wherein the light emitting element does not emit the light when the thin film transistor is on;
wherein a gate electrode of the second thin film transistor is electrically connected to the erasing gate signal line; and
wherein one of a source region and a drain region of the second thin film transistor is electrically connected to the power supply line.

7. A method of operating a light emitting device,
said light emitting device comprising:
  a plurality of pixels;
  each of the plurality of pixels having a plurality of sub-pixels;
  each of the plurality of sub-pixels having a light emitting element, a first thin film transistor, a second thin film transistor, and a third thin film transistor,
said method comprising the steps of:
  turning on the first thin film transistor in a same period in all of the plurality of sub-pixels;
  providing an electric potential of a digital video signal to a gate electrode of the second thin film transistor during the first thin film transistor is on;
  controlling switching of the second thin film transistor by the electric potential of the digital video signal to select whether the light emitting element emits a light or not;
  wherein the light emitting element does not emit the light when the third thin film transistor is on;
  controlling a period of time in which the light emitting element emits the light in each of the plurality of sub-pixels by the digital video signal to thereby control a gradation of the respective pixels,
wherein each of the plurality of sub-pixels has a same area of effective light emission.

8. A method of operating a light emitting device,
said light emitting device comprising:
  a plurality of pixels;
  each of the plurality of pixels having a plurality of sub-pixels; and
  each of the plurality of sub-pixels having a light emitting element, a first thin film transistor, a second thin film transistor, a third thin film transistor, a source signal line, a writing gate signal line, an erasing gate signal line, and a power supply line,
wherein a gate electrode of the first thin film transistor is electrically connected to the writing gate signal line;
wherein one of a source region and a drain region of the first thin film transistor is electrically connected to the source signal line while the other thereof is electrically connected to a gate electrode of the second thin film transistor;
wherein a source region of the second thin film transistor is electrically connected to the power supply line and a drain region of the second thin film transistor is electrically connected to a pixel electrode of the light emitting element;
wherein a gate electrode of the third thin film transistor is electrically connected to the erasing gate signal line; and
wherein one of a source region and a drain region of the third thin film transistor is electrically connected to the power supply line and the other thereof is electrically connected to the gate electrode of the second thin film transistor,
said method comprising the steps of:
  selecting writing gate signal lines of the plurality of pixels in a same period; and
  controlling a period of time in which the light emitting element emits a light in each of the plurality of sub-pixels by a digital video signal inputted to the source signal line to thereby control a gradation of each of the plurality of pixels,
wherein each of the plurality of sub-pixels has a same area of effective light emission.

9. A method of operating a light emitting device,
said light emitting device comprising:
  a plurality of pixels;
  each of the plurality of pixels having a plurality of sub-pixels; and
  each of the plurality of sub-pixels having a light emitting element, a first thin film transistor, a second thin film transistor, a third thin film transistor, a source signal line, an erasing gate signal line, and a power supply line,
wherein the plurality of sub-pixels in a same pixel have commonly a writing gate signal line;
wherein a gate electrode of the first thin film transistor is electrically connected to the writing gate signal line;
wherein one of a source region and a drain region of the first thin film transistor is electrically connected to the source signal line and the other thereof is electrically connected to a gate electrode of the second thin film transistor;
wherein a source region of the second thin film transistor is electrically connected to the power supply line and a drain region of the second thin film transistor is electrically connected to a pixel electrode of the light emitting element;
wherein a gate electrode of the third thin film transistor is electrically connected to the erasing gate signal line; and
wherein one of a source region and a drain region of the third thin film transistor is electrically connected to the power supply line and the other thereof is electrically connected to the gate electrode of the second thin film transistor,
said method comprising the steps of:
  selecting writing gate signal lines of the plurality of pixels in a same period; and
  controlling a period of time in which the light emitting element emits a light in each of the plurality of sub-pixels by a digital video signal inputted to the source signal line to thereby control a gradation of each of the plurality of pixels,
wherein each of the plurality of sub-pixels has a same area of effective light emission.

10. A method of operating a light emitting device,
said light emitting device comprising:
  a plurality of pixels;
  each of the plurality of pixels having a plurality of sub-pixels; and
  each of the plurality of sub-pixels having a light emitting element, a first thin film transistor, a second thin film transistor, a third thin film transistor, a source signal line, a writing gate signal line, and an erasing gate signal line, wherein the plurality of sub-pixels in a same pixel have commonly a power supply line;

wherein a gate electrode of the first thin film transistor is electrically connected to the writing gate signal line;

wherein one of a source region and a drain region of the first thin film transistor is electrically connected to the source signal line and the other thereof is electrically connected to a gate electrode of the second thin film transistor;

wherein a source region of the second thin film transistor is electrically connected to the power supply line and a drain region of the second thin film transistor is electrically connected to a pixel electrode of the light emitting element;

wherein a gate electrode of the third thin film transistor is electrically connected to the erasing gate signal line; and wherein one of a source region and a drain region of the third thin film transistor is electrically connected to the power supply line and the other thereof is electrically connected to the gate electrode of the second thin film transistor, said method comprising the steps of:
selecting writing gate signal lines of the plurality of pixels in a same period; and
controlling a period of time in which the light emitting element emits a light in each of the plurality of sub-pixels by a digital video signal inputted to the source signal line to thereby control a gradation of each of the plurality of pixels, wherein each of the plurality of sub-pixels has a same area of effective light emission.

11. A method of operating a light emitting device,
said light emitting device comprising:
a plurality of pixels;
each of the plurality of pixels having a plurality of sub-pixels; and
each of the plurality of sub-pixels having a light emitting element, a first thin film transistor, a second thin film transistor, a third thin film transistor, a source signal line, and an erasing gate signal line, wherein the plurality of sub-pixels in a same pixel have commonly a writing gate signal line and a power supply line;

wherein a gate electrode of the first thin film transistor is electrically connected to the writing gate signal line;

wherein one of a source region and a drain region of the first thin film transistor is electrically connected to the source signal line and the other thereof is electrically connected to a gate electrode of the second thin film transistor;

wherein a source region of the second thin film transistor is electrically connected to the power supply line and a drain region of the second thin film transistor is electrically connected to a pixel electrode of the light emitting element;

wherein a gate electrode of the third thin film transistor is electrically connected to the erasing gate signal line; and wherein one of a source region and a drain region of the third thin film transistor is electrically connected to the power supply line and the other thereof is electrically connected to the gate electrode of the second thin film transistor, said method comprising the steps of:
selecting writing gate signal lines of the plurality of pixels in a same period; and
controlling a period of time in which the light emitting element emits a light in each of the plurality of sub-pixels by a digital video signal inputted to the source signal line to thereby control a gradation of the respective pixels, wherein each of the plurality of sub-pixels has a same area of effective light emission.

12. A method according to claim 7,
wherein the first thin film transistor in each of the plurality of sub-pixels has a same polarity.

13. A method according to claim 7,
wherein the second thin film transistor in each of the plurality of sub-pixels has a same polarity.

14. A method according to claim 7,
wherein the third thin film transistor in each of the plurality of sub-pixels has a same polarity.

15. A device according to claim 4,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

16. An electronic apparatus using the light emitting device of claim 2.

17. A device according to claim 16,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

18. A method according to claim 5,
wherein the light emitting device is in combination with an electronic apparatus,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

19. A method according to claim 6,
wherein the light emitting device is in combination with an electronic apparatus,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

20. A method according to claim 7,
wherein the light emitting device is in combination with an electronic apparatus,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

21. A method according to claim 8,
wherein the first thin film transistor in each of the plurality of sub-pixels has a same polarity.
22. A method according to claim 8,
wherein the second thin film transistor in each of the plurality of sub-pixels has a same polarity.
23. A method according to claim 8,
wherein the third thin film transistor in each of the plurality of sub-pixels has a same polarity.
24. A method according to claim 8,
wherein the light emitting device is in combination with an electronic apparatus,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.
25. A method according to claim 9,
wherein the first thin film transistor in each of the plurality of sub-pixels has a same polarity.
26. A method according to claim 9,
wherein the second thin film transistor in each of the plurality of sub-pixels has a same polarity.
27. A method according to claim 9,
wherein the third thin film transistor in each of the plurality of sub-pixels has a same polarity.
28. A method according to claim 9,
wherein the light emitting device is in combination with an electronic apparatus,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.
29. A method according to claim 10,
wherein the first thin film transistor in each of the plurality of sub-pixels has a same polarity.
30. A method according to claim 10,
wherein the second thin film transistor in each of the plurality of sub-pixels has a same polarity.
31. A method according to claim 10,
wherein the third thin film transistor in each of the plurality of sub-pixels has a same polarity.
32. A method according to claim 10,
wherein the light emitting device is in combination with an electronic apparatus,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.
33. A method according to claim 11,
wherein the first thin film transistor in each of the plurality of sub-pixels has a same polarity.
34. A method according to claim 11,
wherein the second thin film transistor in each of the plurality of sub-pixels has a same polarity.
35. A method according to claim 11,
wherein the third thin film transistor in each of the plurality of sub-pixels has a same polarity.
36. A method according to claim 11,
wherein the light emitting device is in combination with an electronic apparatus,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.
37. A light emitting device comprising:
a plurality of pixels;
each of the plurality of pixels having a plurality of sub-pixels; and
each of the plurality of sub-pixels having a light emitting element, a first thin film transistor, a second thin film transistor, a third thin film transistor, a source signal line, a writing gate signal line, an erasing gate signal line, and a power supply line,
wherein a gate electrode of the first thin film transistor is electrically connected to the writing gate signal line,
wherein one of a source region and a drain region of the first thin film transistor is electrically connected to the source signal line and the other thereof is electrically connected to a gate electrode of the second thin film transistor;
wherein a source region of the second thin film transistor is electrically connected to the power supply line and a drain region of the second thin film transistor is electrically connected to a pixel electrode of the light emitting element;
wherein a gate electrode of the third thin film transistor is electrically connected to the erasing gate signal line;
wherein one of a source region and a drain region of the third thin film transistor is electrically connected to the power supply line and the other thereof is electrically connected to the gate electrode of the second thin film transistor; and
wherein each of the plurality of sub-pixels has a same area of effective light emission.
38. A light emitting device comprising:
a plurality of pixels;
each of the plurality of pixels having a plurality of sub-pixels; and
each of the plurality of sub-pixels having a light emitting element, a first thin film transistor, a second thin film transistor, a third thin film transistor, a source signal line, an erasing gate signal line, and a power supply line,
wherein the plurality of sub-pixels in a same pixel have commonly a writing gate signal line;
wherein a gate electrode of the first thin film transistor is electrically connected to the writing gate signal line;
wherein one of a source region and a drain region of the first thin film transistor is electrically connected to the source signal line and the other thereof is electrically connected to a gate electrode of the second thin film transistor;
wherein a source region of the second thin film transistor is electrically connected to the power supply line and a drain region of the second thin film transistor is electrically connected to a pixel electrode of the light emitting element;
wherein a gate electrode of the third thin film transistor is electrically connected to the erasing gate signal line;
wherein one of a source region and a drain region of the third thin film transistor is electrically connected to the power supply line and the other thereof is electrically connected to the gate electrode of the second thin film transistor; and
wherein each of the plurality of sub-pixels has a same area of effective light emission.

39. A light emitting device comprising:
a plurality of pixels;
each of the plurality of pixels having a plurality of sub-pixels; and
each of the plurality of sub-pixels having a light emitting element, a first thin film transistor, a second thin film transistor, a third thin film transistor, a source signal line, a writing gate signal line, and an erasing gate signal line,
wherein the plurality of sub-pixels in a same pixel have commonly a power supply line;
wherein a gate electrode of the first thin film transistor is electrically connected to the writing gate signal line;
wherein one of a source region and a drain region of the first thin film transistor is electrically connected to the source signal line and the other thereof is electrically connected to a gate electrode of the second thin film transistor;
wherein a source region of the second thin film transistor is electrically connected to the power supply line and a drain region of the second thin film transistor is electrically connected to a pixel electrode of the light emitting element;
wherein a gate electrode of the third thin film transistor is electrically connected to the erasing gate signal line;
wherein one of a source region and a drain region of the third thin film transistor is electrically connected to the power supply line and the other thereof is electrically connected to the gate electrode of the second thin film transistor; and
wherein each of the plurality of sub-pixels has a same area of effective light emission.

40. A light emitting device comprising:
a plurality of pixels;
each of the plurality of pixels having a plurality of sub-pixels; and
each of the plurality of sub-pixels having a light emitting element, a first thin film transistor, a second thin film transistor, a third thin film transistor, a source signal line, and an erasing gate signal line,
wherein the plurality of sub-pixels in a same pixel have commonly a writing gate signal line and a power supply line;
wherein a gate electrode of the first thin film transistor is electrically connected to the writing gate signal line;
wherein one of a source region and a drain region of the first thin film transistor is electrically connected to the source signal line and the other thereof is electrically connected to a gate electrode of the second thin film transistor;
wherein a source region of the second thin film transistor is electrically connected to the power supply line and a drain region of the second thin film transistor is electrically connected to a pixel electrode of the light emitting element;
wherein a gate electrode of the third thin film transistor is electrically connected to the erasing gate signal line;
wherein one of a source region and a drain region of the third thin film transistor is electrically connected to the power supply line and the other thereof is electrically connected to the gate electrode of the second thin film transistor; and
wherein each of the plurality of sub-pixels has a same area of effective light emission.

41. A light emitting device according to claim 37,
wherein the first thin film transistor in each of the plurality of sub-pixels has a same polarity.

42. A light emitting device according to claim 37,
wherein the second thin film transistor in each of the plurality of sub-pixels has a same polarity.

43. A light emitting device according to claim 37,
wherein the third thin film transistor in each of the plurality of sub-pixels has a same polarity.

44. An electronic apparatus having a light emitting device according to claim 37,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

45. A light emitting device according to claim 38,
wherein the first thin film transistor in each of the plurality of sub-pixels has a same polarity.

46. A light emitting device according to claim 38,
wherein the second thin film transistor in each of the plurality of sub-pixels has a same polarity.

47. A light emitting device according to claim 38,
wherein the third thin film transistor in each of the plurality of sub-pixels has a same polarity.

48. An electronic apparatus having a light emitting device according to claim 38,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

49. A light emitting device according to claim 39,
wherein the first thin film transistor in each of the plurality of sub-pixels has a same polarity.

50. A light emitting device according to claim 39,
wherein the second thin film transistor in each of the plurality of sub-pixels has a same polarity.

51. A light emitting device according to claim 39,
wherein the third thin film transistor in each of the plurality of sub-pixels has a same polarity.

52. An electronic apparatus having a light emitting device according to claim 39,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

53. A light emitting device according to claim 40,
wherein the first thin film transistor in each of the plurality of sub-pixels has a same polarity.

54. A light emitting device according to claim 40,
wherein the second thin film transistor in each of the plurality of sub-pixels has a same polarity.

55. A light emitting device according to claim 40,
wherein the third thin film transistor in each of the plurality of sub-pixels has a same polarity.

56. An electronic apparatus having a light emitting device according to claim 40,
wherein the electronic apparatus is one selected from the group consisting of an electro-luminescence display device, a digital still camera, a laptop (note-size) computer, a mobile computer, an image reproduction apparatus, a goggle type display (head mounted display), a video camera, a mobile phone (cellular phone), a front-type projector and a rear-type projector.

* * * * *